(12) United States Patent　　(10) Patent No.:　　US 9,041,039 B2
　　Emura et al.　　　　　　　　　(45) Date of Patent:　　May 26, 2015

(54) SEMICONDUCTOR LIGHT EMITTING ELEMENT

(71) Applicant: NICHIA CORPORATION, Anan-shi, Tokushima (JP)

(72) Inventors: Keiji Emura, Anan (JP); Akihiro Miyagi, Anan (JP); Shun Kitahama, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/167,016

(22) Filed: Jan. 29, 2014

(65) Prior Publication Data

US 2014/0209938 A1　Jul. 31, 2014

(30) Foreign Application Priority Data

Jan. 30, 2013　(JP) ................................. 2013-014932
Apr. 24, 2013　(JP) ................................. 2013-091224
Sep. 30, 2013　(JP) ................................. 2013-203610

(51) Int. Cl.
　　*H01L 27/15*　　(2006.01)
　　*H01L 33/62*　　(2010.01)
　　*H01L 33/08*　　(2010.01)
　　*H01L 33/20*　　(2010.01)
　　*H01L 33/38*　　(2010.01)

(52) U.S. Cl.
　　CPC ................ *H01L 33/62* (2013.01); *H01L 27/15* (2013.01); *H01L 33/08* (2013.01); *H01L 27/156* (2013.01); *H01L 33/20* (2013.01); *H01L 33/38* (2013.01); *H01L 2933/0016* (2013.01); *H01L 2924/0002* (2013.01)

(58) Field of Classification Search
　　USPC ...................................................... 257/88, 91
　　See application file for complete search history.

(56) References Cited

U.S. PATENT DOCUMENTS

| 8,648,355 B2 * | 2/2014 | Choi ............................... 257/79 |
| 2002/0117677 A1 * | 8/2002 | Okuyama et al. ............... 257/94 |
| 2005/0179130 A1 * | 8/2005 | Tanaka et al. .................. 257/730 |
| 2006/0044864 A1 | 3/2006 | Lin et al. |
| 2007/0131941 A1 * | 6/2007 | Tanaka et al. ................... 257/79 |
| 2007/0284598 A1 | 12/2007 | Shakuda et al. |

(Continued)

FOREIGN PATENT DOCUMENTS

| JP | 2006-073815 A | 3/2006 |
| JP | 2006-073979 A | 3/2006 |

(Continued)

*Primary Examiner* — Eva Y Montalvo
*Assistant Examiner* — Grant Withers
(74) *Attorney, Agent, or Firm* — Global IP Counselors, LLP

(57) ABSTRACT

A semiconductor light emitting element includes: an insulating substrate having a plurality of convex portions on a surface thereof; a plurality of light emitting element components having semiconductor laminated bodies that are laminated on the insulating substrate and are separated from one another by a groove that exposes the convex portions; and a connector connecting between the light emitting element components. The light emitting element components include a first light emitting element component and a second light emitting element component. The first light emitting element component is separated from the second light emitting element component with the groove in between, and has a first protrusion that protrudes toward the second light emitting element component. The connector includes a first connector having a shape that straddles the groove and that follows the convex portions, and has a straight section.

28 Claims, 20 Drawing Sheets

(56) References Cited

U.S. PATENT DOCUMENTS

| | | | |
|---|---|---|---|
| 2008/0185606 A1* | 8/2008 | Sano et al. | 257/98 |
| 2008/0218093 A1 | 9/2008 | Lin et al. | |
| 2008/0303042 A1* | 12/2008 | Minato et al. | 257/98 |
| 2009/0026475 A1* | 1/2009 | Yamaguchi et al. | 257/98 |
| 2009/0218580 A1 | 9/2009 | Lin et al. | |
| 2009/0322241 A1* | 12/2009 | Onushkin et al. | 315/250 |
| 2010/0052494 A1* | 3/2010 | Feng et al. | 313/3 |
| 2010/0289041 A1 | 11/2010 | Shakuda | |
| 2011/0001147 A1* | 1/2011 | Cheng et al. | 257/79 |
| 2011/0012137 A1 | 1/2011 | Lin et al. | |
| 2011/0073879 A1* | 3/2011 | Sakai et al. | 257/88 |
| 2011/0095323 A1* | 4/2011 | Han | 257/98 |
| 2011/0204387 A1* | 8/2011 | Kim et al. | 257/88 |
| 2011/0210352 A1* | 9/2011 | Lee et al. | 257/93 |
| 2011/0291070 A1* | 12/2011 | Won et al. | 257/13 |
| 2011/0316004 A1* | 12/2011 | Yoon et al. | 257/79 |
| 2011/0316126 A1* | 12/2011 | Emura et al. | 257/632 |
| 2012/0007499 A1 | 1/2012 | Onushkin et al. | |
| 2012/0018766 A1* | 1/2012 | Emura | 257/99 |
| 2012/0135557 A1* | 5/2012 | Okuno | 438/39 |
| 2012/0199868 A1* | 8/2012 | Inoue et al. | 257/99 |
| 2012/0235584 A1 | 9/2012 | Onushkin et al. | |
| 2012/0286284 A1* | 11/2012 | Tachibana et al. | 257/76 |
| 2013/0214320 A1* | 8/2013 | Onishi et al. | 257/99 |
| 2013/0306997 A1* | 11/2013 | Lim et al. | 257/88 |
| 2014/0008665 A1* | 1/2014 | Jo et al. | 257/77 |
| 2014/0124805 A1* | 5/2014 | Minato et al. | 257/95 |
| 2014/0131729 A1* | 5/2014 | Heo et al. | 257/76 |
| 2014/0231748 A1* | 8/2014 | Kim et al. | 257/13 |

FOREIGN PATENT DOCUMENTS

| | | |
|---|---|---|
| JP | 2010-016333 A | 1/2010 |
| JP | 2011-171739 A | 9/2011 |
| WO | 2009-088084 A | 7/2009 |

* cited by examiner

SEMICONDUCTOR LIGHT EMITTING ELEMENT

CROSS-REFERENCE TO RELATED APPLICATIONS

This application claims priority to Japanese Patent Applications No. 2013-14932, No. 2013-91224 and No. 2013-203610 filed on Jan. 30, 2013, Apr. 24, 2013 and Sep. 30, 2013, respectively. The entire disclosure of Japanese Patent Applications No. 2013-14932, No. 2013-91224 and No. 2013-203610 are hereby incorporated herein by reference.

BACKGROUND OF THE INVENTION

1. Background Information

The present invention relates to a semiconductor light emitting element.

2. Background Art

A structure for a light emitting element that gives uniform light emission has been proposed in the past in which a semiconductor laminated body including an active layer laminated on a substrate having a surface with concavities and convexities is divided into a plurality of small regions, which are electrically connected and arranged longitudinally and/or laterally (e.g., JP2011-171739A).

With this light emitting element structure, grooves that expose the concavities and convexities on the substrate surface are provided in order to divide into small regions. Wiring layers that straddle the grooves and follow the grooves are formed in order to electrically connect the divided small regions.

In a conventional light emitting element structure, power cannot be supplied to any of the small regions if there is discontinuity in just one place of the wiring layer. Also, the whole wiring layer has to be inspected in order to identify where the discontinuity occurred, which may lower the yield and drive up the manufacturing cost.

SUMMARY OF THE INVENTION

The present invention was conceived in light of the above problem, and it is an object thereof to provide a semiconductor light emitting element with which good quality, no discontinuity in the wiring layer, etc., can be ensured even when a wiring layer is provided that conforms to bumps on the bottom face of the grooves.

The inventors conducted diligent research into the above problem, and discovered that thinning of the wiring layer is apt to occur at the plurality of convex portions on the substrate surface, and particularly at places corresponding to the sides of the convex portions, and that this can lead to discontinuity of the wiring layer. The inventors also made the new discovery that when the number of small regions is increased, there are more connection styles of the wiring layer between small regions, and electrical connection is made even between small regions that are adjacent diagonally, and discontinuity is markedly more likely to occur when this happens.

As a result, the inventors perfected a semiconductor light emitting element that gives uniformly high emission strength and with which high quality, no discontinuity of the wiring layer, etc. is ensured, even when there is a wiring layer that conforms to bumps in the bottom face of the grooves, by keeping the width of the grooves that expose the convex portions of the substrate surface used for separation to a minimum.

A semiconductor light emitting element according to one aspect includes: an insulating substrate having a plurality of convex portions on a surface thereof; a plurality of light emitting element components having semiconductor laminated bodies that are laminated on the insulating substrate and are separated from one another by a groove that exposes the convex portions on the surface of the insulating substrate; and a connector connecting between the light emitting element components. The light emitting element components include a first light emitting element component and a second light emitting element component. The first light emitting element component is separated from the second light emitting element component with the groove in between, and has a first protrusion that protrudes toward the second light emitting element component. The connector includes a first connector having a shape that straddles the groove separating the first protrusion and the second light emitting element component and that follows the convex portions on the surface of the insulating substrate, and has a straight section extending from the first protrusion toward the second light emitting element component in plan view A semiconductor light emitting element according to another aspect includes: an insulating substrate having a plurality of convex portions on a surface thereof; a plurality of light emitting element components having semiconductor laminated bodies that are laminated on the insulating substrate and are separated from one another by a groove that exposes the convex portions on the surface of the insulating substrate, and the light emitting element components being disposed in a matrix in which sides of the light emitting element components in a column direction and a row direction in plan view face each other; and a plurality of connectors connecting the light emitting element components. The light emitting element components include a first light emitting element component and a second light emitting element component disposed obliquely in plan view. The first light emitting element component has a first protrusion disposed at a corner of the first light emitting element and protruding toward a corner of the second light emitting element component. The connectors include a first connector having a shape that straddles the groove separating the first protrusion and the corner of the second light emitting element component and that follows the convex portions on the surface of the insulating substrate. The first connector has a straight section extending from the first protrusion toward the corner of the second light emitting element component.

According to the present invention, a semiconductor light emitting element that gives uniformly high emission strength and with which high quality, no discontinuity of the wiring layer, etc. is ensured can be realized.

DETAILED DESCRIPTION OF EXEMPLARY EMBODIMENTS

Figure 1A:
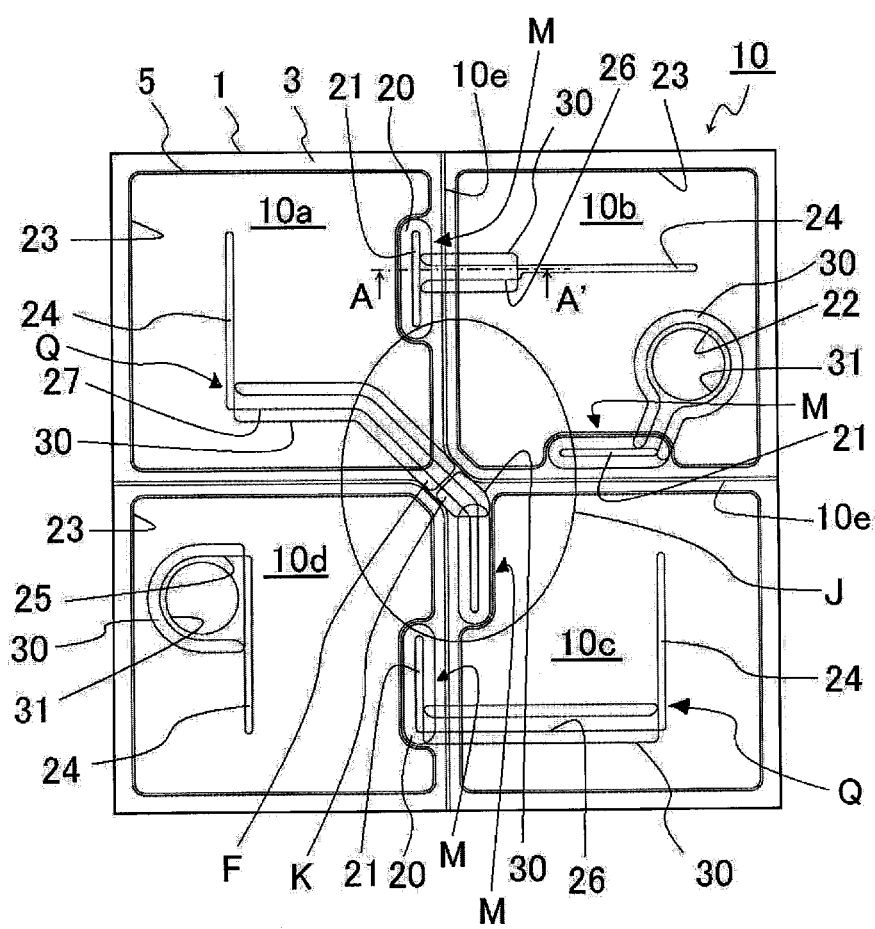
FIG. 1A is a simplified plan view of an embodiment of the semiconductor light emitting element of the present invention.
Figure 1B:
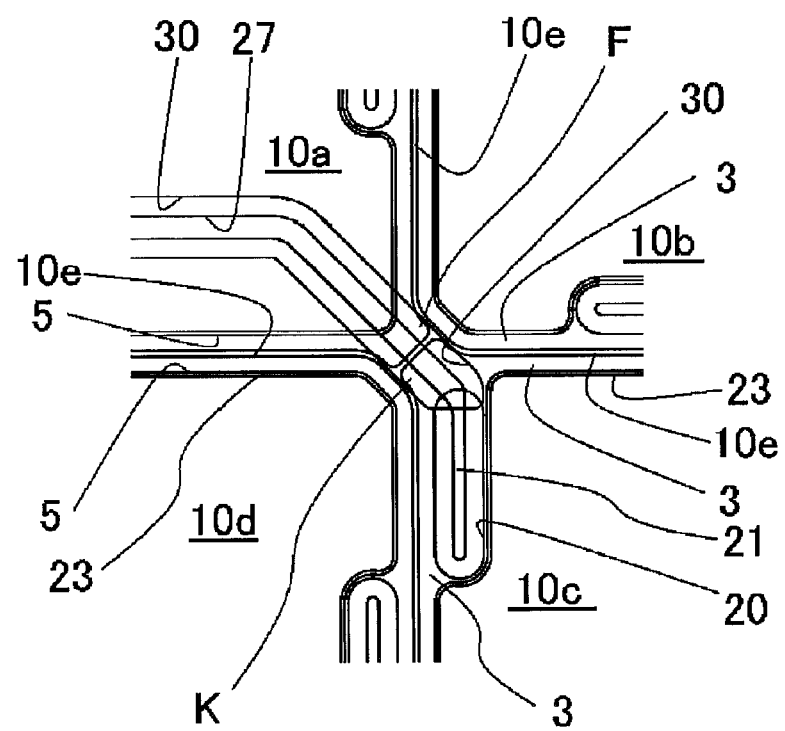
FIG. 1B is a detail view of the J region of the semiconductor light emitting element in FIG. 1A.

In the following description, terms indicating a specific direction or position (such as "upper," "lower," "right," "left," and other terms that include these) will be used as needed. These terms are used to facilitate an understanding of the invention shown in the drawings, but the technological scope of the present invention is not limited by the meanings of these terms. Components that are numbered the same in multiple drawings indicate the same portions, members, or functional members. The description is divided up into different embodiments to aid in an understanding of the invention, but these embodiments are not each independent, and shared areas will come under the description of other embodiments.

The semiconductor light emitting element of the present invention has a substrate, a plurality of light emitting element components, and one or more connector.

Substrate

The substrate may be one which can be grown semiconductor layers and has an insulating property. Examples of the material for the substrate include an insulating substrate such as sapphire ($Al_2O_3$) and spinel ($MgAl_2O_4$), and the like. Among these, the substrate which has a main surface of any one of C plane, A plane, R plane, M plane is preferable. The substrate which has A plane or C plane as an orientation flat plane is more preferable. In particular, a sapphire substrate which has C plane (0001) as the main surface and A plane (11-20) of the orientation flat plane is still more preferable.

The substrate has a plurality of convex portions on its surface. The term "convex portion" means a portion that sticks out from a certain reference plane when the substrate is seen in cross section. Therefore, the substrate may have a plurality of concaves on its surface, or may have both convex portions and concaves. There are no particular restrictions on the size, height, shape, and the like of the convex portions, which can be set as desired.

For example, the size of the planar shape (bottom face shape) of the convex portions, that is, the length of one of the constituent sides of a convex portion, is about 0.1 to 5 µm. The spacing between the convex portions is about 100 µm or less, and preferably about 20 µm or less. The spacing between the convex portions refers to the minimum distance between adjacent convex portions on the substrate surface (the convex portion bottom face).

The height of the convex portions is, for example, about 5 nm or more, and preferably is no more than the total thickness of the semiconductor layer laminated over the substrate. This is to ensure good emission efficiency and to allow the light to be adequately scattered or diffracted.

Examples of the shape of the convex portions include that of a circular column, a polyhedral column that is triangular, quadrangular, hexagonal, etc., a circular truncated cone, and a polyhedral truncated cone. In this Specification, these shape expressions encompass not only an indication of the complete geometric shape, but also shapes that are similar or somewhat modified, such as those in which the corners have been rounded off, for reasons such as machining.

The convex portions on the surface of the substrate can be formed by any method that is known in this field. For example, they can be formed by wet or dry etching (discussed below) using a mask pattern in a suitable shape. Wet etching is preferable. Examples of the etchant that can be used here include a mixture of sulfuric acid and phosphoric acid, KOH, NaOH, phosphoric acid, and potassium pyrosulfate.

The bottom face of the convex portions can be controlled by suitably adjusting the shape of the mask pattern and the etching method and conditions that are used.

The surface of the substrate may have an off angle of about 0 to ±10°.

An intermediate layer, such as a buffer layer or a high resistance layer (such as a layer of non-doped GaN, AlGaN, or AlN), that is electrically isolated or does not contribute to light emission may be formed between the substrate and the first semiconductor layer (discussed below). An example of a layer of high resistance is one sufficient to prevent shorting.

Light Emitting Element Components

The light emitting element components have a semiconductor laminated body. The semiconductor laminated body has, for example, a first semiconductor layer (such as an n-side semiconductor layer), an active layer, and a second semiconductor layer (such as a p-side semiconductor layer) that are laminated in that order, and functions as a plurality of light emitting element components. To that end, the semiconductor laminated bodies are separated (electrically isolated) from one another by grooves that expose the convex portions on the substrate surface. The grooves expose at least part of the convex portions on the substrate surface, at the bottom face of the grooves. Therefore, places that are separated from each other by grooves, or are surrounded by grooves, are referred to as light emitting element components. Also note that the term "n-side semiconductor layer" includes an n-type semiconductor layer, and the term "p-side semiconductor layer" includes a p-type semiconductor layer.

There are no particular restrictions on the kind and material of the first semiconductor layer, the active layer and the second semiconductor layer, for example, examples thereof include various semiconductor such as a III-V compound semiconductor, a II-V compound semiconductor. More specifically, examples thereof include a gallium nitride-based semiconductor material such as $In_XAl_YGa_{1-X-Y}N$ ($0 \leq X$, $0 \leq Y$, $X+Y \leq 1$), InN MN, GaN, InGaN, AlGaN, InGaAlN, and the like can be used. For, a known a thickness or a laminated structure of each layer in the art can be used.

There are a plurality of light emitting element components, such as two or more, and preferably four or more, in a single semiconductor light emitting element. The upper limit to this can be suitably adjusted as dictated by the size of the semiconductor light emitting element. More specifically, if the length of one side of a single semiconductor light emitting element is from about 100 μm to 5 mm, then there are about 2 to 180, and preferably about 4 to 180, of these components.

The plurality of light emitting element components are arranged regularly or randomly on the substrate. Preferably, they are arranged in columns and rows in plan view. It is particularly preferable for them to be arranged in a matrix so that the sides are opposite each other in the column direction and the row direction. The plurality of the light emitting element components are preferably arranged in matrix of even number×odd number, odd number×even number, or even number×even number of components, and an even number×even number matrix is particularly preferable. With a matrix arrangement such as this, good electrical connection can be ensured when there are connectors connecting the components in a column, a row, diagonally, or any other direction. The phrase "arranged in a matrix" used in the present invention does not mean that the lengths of the opposing sides of adjacent light emitting element components have to be the same. Also, part of the opposing sides of light emitting element components that are adjacent in plan view may overlap in the column direction or the row direction. In other words, this includes a case in which the arrangement of adjacent light emitting element components is partially offset (not matching) in the column or row direction.

As long as the above-mentioned arrangement is achieved, there are no particular restrictions on the shape of the light emitting element components in plan view. Examples include substantially quadrangular, substantially rectangular, polygon and shapes similar to these. A substantially rectangular shape is particularly preferable when a plurality of light emitting element components are arranged in a matrix.

Of the plurality of light emitting element components, two of the light emitting element components arranged in a column, a row, diagonally, or any other such direction (these will be called the first light emitting element component and the second light emitting element component) can be such that one (the first) light emitting element component has a protrusion that protrudes toward another (the second) light emitting element component. In particular, two light emitting element components arranged diagonally (such as in a first diagonal direction) (these will be called the first light emitting element component and the second light emitting element component) can be such that the corner of one (the first) light emitting element component has a protrusion that protrudes toward the corner of another (the second) light emitting element component. Thus, the above-mentioned similar shapes encompass modifications in the corner (that is, the presence of a protrusion). The length of the protrusion may be greater than, equal to, or less than the distance between light emitting element components that are separated by a groove, and the distance between light emitting element components disposed in a second diagonal direction that is different from the first diagonal direction (such as a diagonal direction perpendicular to the first diagonal direction). The protrusion may be a first protrusion in which any part of one light emitting element component protrudes toward any part of another light emitting element component, or may be a second protrusion in which any part of another light emitting element component protrudes toward the one light emitting element component. Alternatively, the corner of one light emitting element component may be a first protrusion that protrudes toward the corner of another light emitting element component, or the corner of another light emitting element component may be a second protrusion that protrudes toward the corner of the one light emitting element component.

When the light emitting element component has a polygon shape in plan view, the protrusion may be a first protrusion in which any part of one side of one light emitting element component protrudes toward any part of another light emitting element component, may be a first protrusion in which any part of one side of one light emitting element component protrudes toward any part of one side of another light emitting element component, or may be a second protrusion in which any part of one side of another light emitting element component protrudes toward any part of one side of one light emitting element component.

In other words, two light emitting element components (such as adjacent light emitting element components, or two light emitting element components that are opposite in the first diagonal direction) are separated by a groove having a particular shape. Because of this groove, the protrusion that protrudes toward one light emitting element component or toward a mutually opposing light emitting element component is defined and disposed. This groove of a particular shape includes, for example, grooves that surround a side, a corner, and/or a protrusion of a light emitting element component in plan view. Also included are grooves that surround the corners of two light emitting element components that are opposite in the second diagonal direction, and groove that links these two grooves (preferably in a straight line). The groove in this case will be substantially H-shaped in plan view.

There are no particular restrictions on the width of the grooves separating the light emitting element components, as long as the grooves are wide enough to electrically isolate the light emitting element components. The side faces of the grooves (that is, the side faces of the substrate and the side faces of the semiconductor laminated bodies) may be substantially vertical, but they may instead be tapered, inversely tapered, or otherwise sloped. In particular, if the groove has a shape that is wider at the top face than at the bottom face, this will make it easier to bond the material of the connector to the side face of the groove, as discussed below. As a result, discontinuity can be prevented at places on the connector that straddle the groove. In this Specification, "width" means the length in a direction perpendicular to the extension direction in top view.

The width of the groove may vary with the location. In particular, the groove is preferably wider at places where a connector is disposed than at other locations (see the grooves 16e in FIGS. 7A and 8A). The term "wider" here means a width that is 150 to 500% of the width at other locations, for example. However, it is preferable for the groove width to be constant. If the groove width at the place straddled by the connector is kept constant, then fluctuation in the thickness of the connector can be prevented when there is an extra allowance to ensure enough groove width to ensure the thickness of a wiring. As a result, there will be no places where the connector is locally weaker.

(1) The distance from the first protrusion to another light emitting element component, that is, the distance between two light emitting element components or the width of the groove straddled by the connector, may be different from the distance between a light emitting element component including a first protrusion at another location, and another light emitting element component.

Figure 9A:
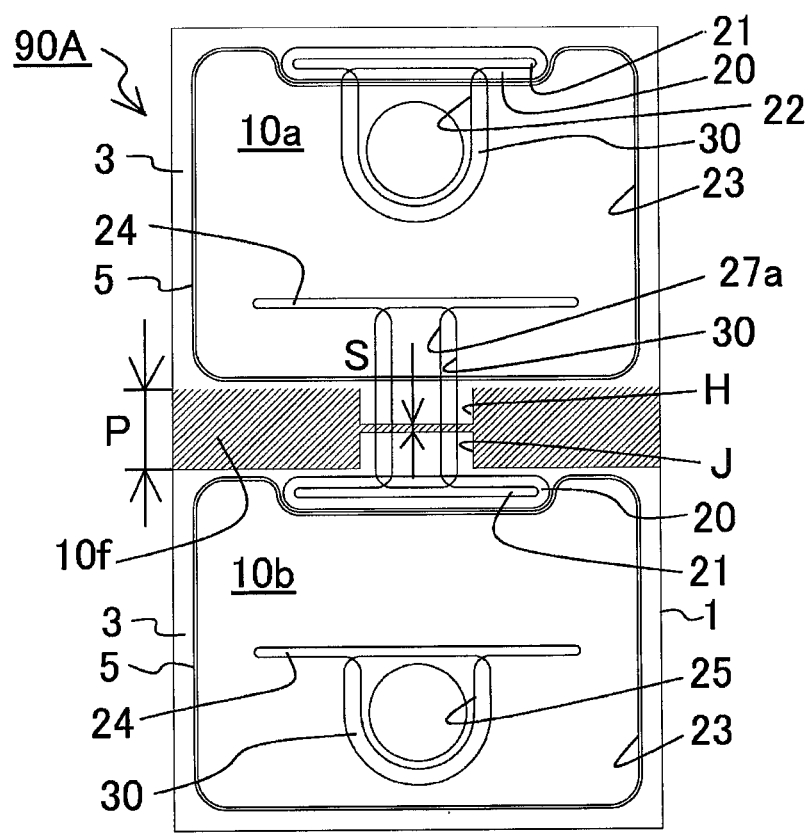
FIG. 9A is a simplified plan view of yet another embodiment of the semiconductor light emitting element of the present invention.
Figure 9B:
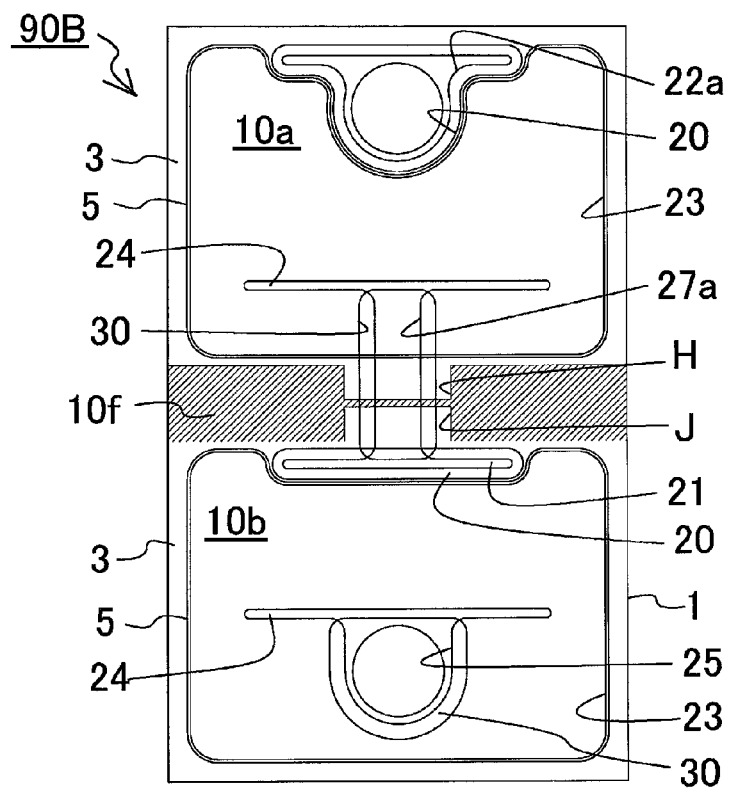
FIG. 9B is a simplified plan view of yet another embodiment of the semiconductor light emitting element of the present invention.
Figure 9C:
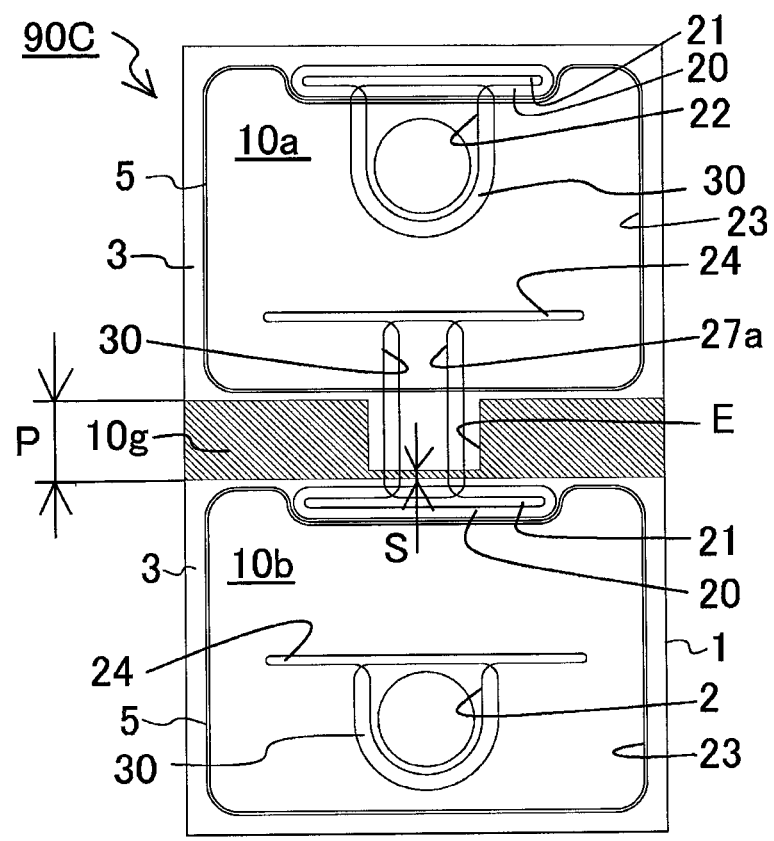
FIG. 9C is a simplified plan view of yet another embodiment of the semiconductor light emitting element of the present invention.

Referring to FIG. 9C, the distance S (the width of the groove 10g) from the first protrusion E to another light emitting element component 10b is from a few microns to 20 μm, for example, with a range of from a few microns to a more than a dozen microns being preferable.

The distance P (the width of the groove) between the light emitting element component 10a including the first protrusion E and its adjacent light emitting element component 10b is from 5 to 45 μm, for example.

(2) The distance between the first protrusion and second protrusion, that is, the distance between two light emitting element components or the width of the groove straddled by the first connector, may be different from the distance between a light emitting element component including a first protrusion at another location and a light emitting element component including a second protrusion.

Referring to FIG. 9A, the distance S (the width of the groove) between a first protrusion H and a second protrusion J is about the same as the above-mentioned distance S.

The distance P between the light emitting element component 10a including the first protrusion H and the light emitting element component 10b including the second protrusion J is about the same as that given above.

Alternatively, (3) the width of the groove straddled by the first connector is preferably the same as the maximum width of the groove between two light emitting element components that are adjacent in the column direction or the row direction.

For example, the distance from the first protrusion to the corner of another light emitting element component may be different from the distance between two light emitting element components that are adjacent in the column direction or the row direction, but is preferably the same as the maximum distance between two light emitting element components that are adjacent in the column direction or the row direction. In other words, the width of the groove between the first protrusion and the corner of the second light emitting element component is preferably the same as the maximum width of the groove between two light emitting element components that are adjacent in the column direction or the row direction.

Figure 6:
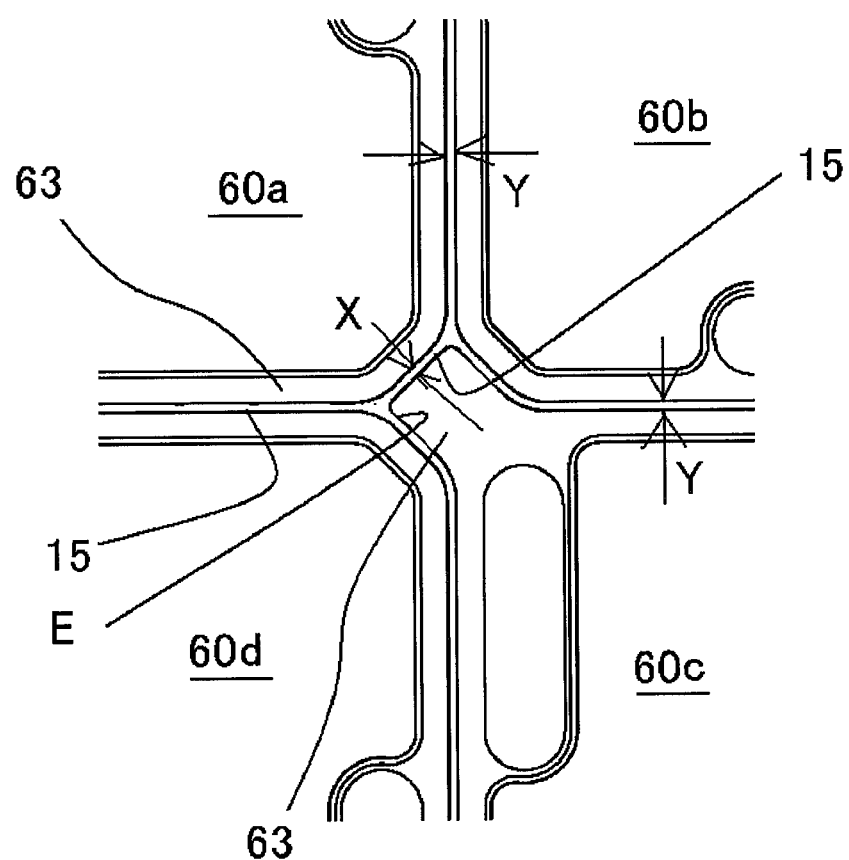
FIG. 6 is a simplified plan view of yet another embodiment of the semiconductor light emitting element of the present invention.

Referring to FIG. 6, the distance X (the width of the groove) from the first protrusion E to the corner of another light emitting element component 60a is from a few microns to 20 μm, for example, and preferably from a few microns to a few dozen microns.

The distance Y (the width of groove) between two light emitting element components 60a and 60b, 60b and 60c that are adjacent in the column direction or the row direction is from a few microns to 20 μm, for example, and preferably from a few microns to a few dozen microns.

Also, (4) the distance between the first protrusion and the second protrusion may be different from the distance between two light emitting element components that are adjacent in the column direction or the row direction, but is preferably the same as the maximum distance between two light emitting element components that are adjacent in the column direction or the row direction. In other words, the width of the groove between the first protrusion and the second protrusion is preferably the same as the maximum width of the groove between two light emitting element components that are adjacent in the column direction or the row direction.

Figure 1C:
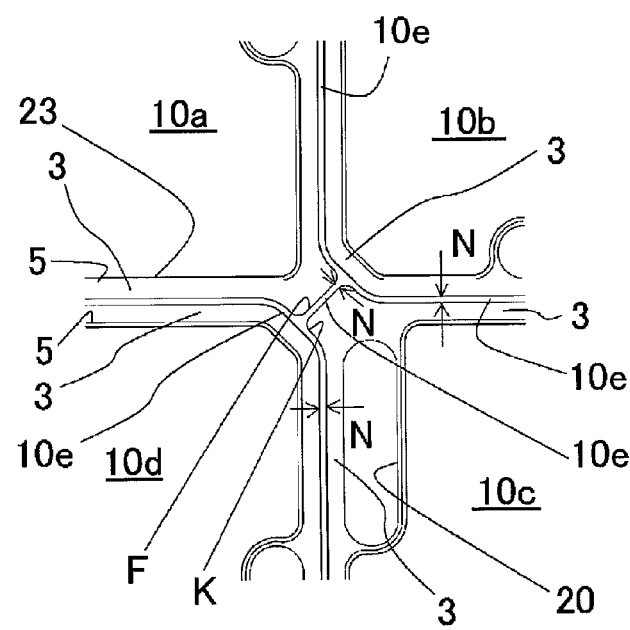
FIG. 1C is a detail view of the J region of the semiconductor light emitting element in FIG. 1B, which illustrates the shape of the grooves and protrusions, but does not show the wiring or the insulating film.

For example, referring to FIG. 1C, the distance N (the width of the groove) between the first protrusion K and the second protrusion F is about the same as the distance X from the above-mentioned first protrusion to the corner of another light emitting element component (see FIG. 6).

Usually, the connector is formed by sputtering or another such method. In sputtering, the farther apart the light emitting element components are (the wider is the groove), the easier it is for the material of the connector (particles) to go into the grooves, so the connector material is more apt to adhere to the side faces of the light emitting element components, the side faces of the convex portions, and the surface of the semiconductor. Therefore, fluctuation in the thickness of the connector can be prevented, and the occurrence of local weak portions can be suppressed in the connector, by keeping the groove width constant at the place straddled by the connector when there is an extra allowance to ensure enough groove width to ensure the thickness of the wiring.

When light emitting elements are disposed adjacent to each other in the column direction or the row direction, of two light emitting element components that are adjacent in the column direction or the row direction, the distance M (the width of the groove) between two light emitting element components connected by a second connector (discussed below) may be the same as the distance N (the width of the groove) between two light emitting element components that are adjacent in the column direction or the row direction without being connected by the second connector, but the distance M is preferably greater than the distance N.

Figure 2A:
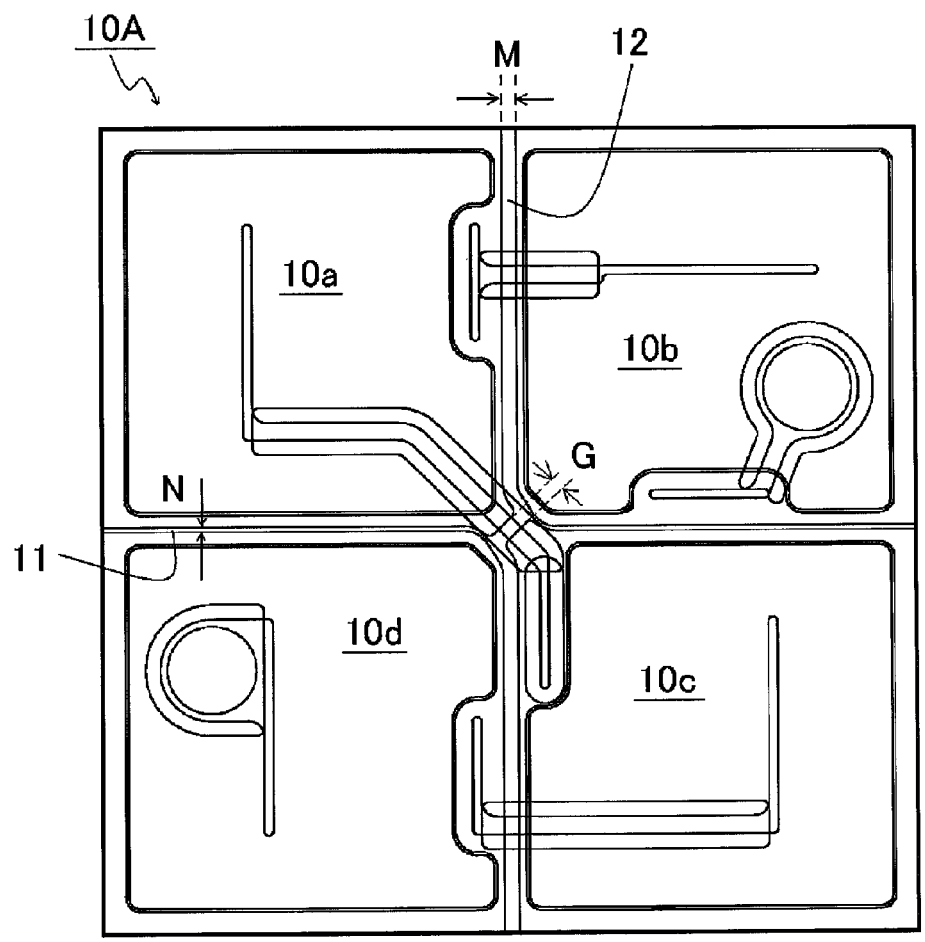
FIG. 2A is a simplified plan view of another embodiment of the semiconductor light emitting element of the present invention.
Figure 2B:
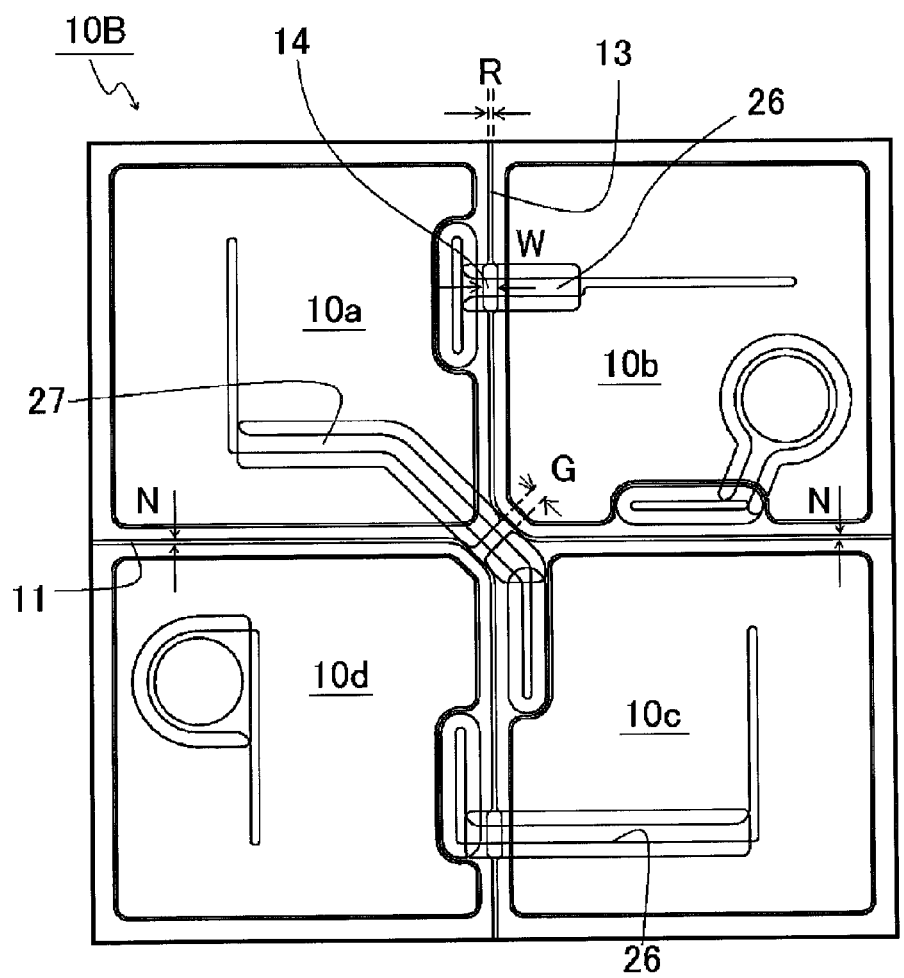
FIG. 2B is a simplified plan view of yet another embodiment of the semiconductor light emitting element of the present invention.

For example, referring to FIGS. 2A and 2B, the distances M and R (the width of the groove) from the first protrusion to the second protrusion is from a few microns to 20 μm, for example, with a range of 8 to 20 μm being preferable.

The distance N (the width of the groove) between the light emitting element components 10a and 10c, and 10b and 10d, that are adjacent in the column direction or the row direction without being connected by the second connector is from a few microns to 20 μm, for example, with a range of from a few microns to more than a dozen microns being preferable.

As discussed above, if the formation of the connectors is taken into account, it is preferable for the distance between light emitting element components (the width of the groove) to be greater. On the other hand, increasing the width of all the grooves cause a reduction in the surface area of the light emitting element components, that is, a smaller emission surface area. Therefore, it is preferable if, as shown in FIG. 2A, just the column direction or the row direction of the grooves straddled by the second connector (the width M of the groove), or as shown in FIG. 2B, just the grooves around the second connector, are made wider than at other places.

The light emitting element components preferably have, in a partial region thereof, an exposed portion where the first semiconductor layer is exposed and the second semiconductor layer and the active layer are removed in the entire film thickness direction. Part of this exposed portion can be used to electrically connect a first electrode (discussed below) with the first semiconductor layer. There are no particular restrictions on the size, shape, or position of this exposed portion, which can be suitably set as dictated by the intended size, shape, connection state, and the like of the intended light emitting element.

The exposed portion is preferably disposed all or part of the way around the light emitting element components. When the exposed portion is thus disposed around the light emitting element components, the width and length of the exposed portion are preferably adjusted as needed. This allows the active layer functioning as the light emitting layer to have the same or substantially the same size and shape even if there are light emitting element components that do and do not include the above-mentioned protrusion. As a result, the emission strength can be made more uniform, etc.

The protrusion may be formed by the semiconductor laminated body. It is particularly favorable for it to be formed including the exposed portion, and even better for it to be formed only by the region where just the first semiconductor layer is disposed (the exposed portion). Consequently, regardless of the shape, etc., of the protrusion, the emission surface area for all of the light emitting element components can be made uniform, and a uniform emission strength can be achieved.

The light emitting element components may be of two or more different sizes in a single semiconductor light emitting element, or they may all be the same size. It is preferable if the shape and/or the surface area of the active layer functioning as the light emitting layer is the same in all of the light emitting element components.

Usually, the light emitting element components each have a first electrode that is electrically connected to the first semiconductor layer, and a second electrode that is electrically connected to the second semiconductor layer. A second translucent electrode is preferably provided on the second semiconductor layer. A first translucent electrode can also be provided on the first semiconductor layer.

The second electrode is electrically connected to the second semiconductor layer. The second electrode is usually disposed on the second translucent electrode.

The first electrode can utilize the above-mentioned exposed portion to electrically connect with the first semiconductor layer. The first electrode may be disposed on the first translucent electrode. Current diffusion can be promoted if the first translucent electrode disposed under the first electrode is wider than the first electrode. Also, of the light emitted from the active layer, light that exceeds a critical angle between the first semiconductor layer and the first translucent electrode can be totally reflected, without being absorbed by the first electrode. As a result, light extraction can be improved.

In this Specification, the "first electrode" and "second electrode" refer to portions touching or electrically connected to the first translucent electrode, the second translucent electrode, or the semiconductor layer.

The first electrode and the second electrode can be formed of, for example, a single-layer or a laminated structure of metal or alloy of Au, Pt, Pd, Rh, Ni, W, Mo, Cr, Ti and the like. In particularly, these electrodes can be formed of a laminated structure of Ti/Rh/Au, W/Pt/Au, Rh/Pt/Au, W/Pt/Au, Ni/Pt/Au, Ti/Rh and the like respectively stacked in this order from the semiconductor side. The film thickness may be any thickness that is used in this field.

In order to facilitate the diffusion and supply of current, it is usually preferable for the first electrode and second electrode to have a shape that is greater in length in one direction than the length (width) in the other direction perpendicular thereto, that is, a shape that is elongated in one direction (a slender shape). For example, this can be an I shape, L shape, U shape, or other such shape, according to the shape of the light emitting element components. The elongation directions of the first electrode and second electrode may be different in plan view, but are preferably the same, and it is more preferable if the two electrodes have mutually parallel parts.

It is generally preferable if the translucent electrodes are disposed over the entire surface of the first semiconductor layer and second semiconductor layer in each light emitting element component, or in an area slightly smaller than the outer periphery of these. This allows the current supplied from the connectors to flow uniformly to the entire plane of the semiconductor layer.

The translucent electrodes can be formed by any method that is normally used in this field. It is particularly preferable to use a material with high optical transmissivity in the wavelength band of the light emitted by the active layer, since the translucent electrodes are disposed on the light extraction side of the semiconductor light emitting element. This increases the emission efficiency of the semiconductor light emitting element. Examples of this material include conductive oxides containing one or more of indium, zinc, tin, magnesium, gallium, tungsten, and titanium, and more specific examples include ITO, IZO, ZnO, $In_2O_3$, $SnO_2$, $TiO_2$, and compound oxides of these. ITO can be used to particular advantage because it is a material that has high optical transmissivity of visible light (the visible band), and has relatively high conductivity. The film thickness may be any thickness that is used in this field.

Connector

One or more connectors are formed in a single semiconductor light emitting element for connecting the light emitting element components together. The connectors connect the first electrode and second electrode, respectively, of each light emitting element component. The connection mode of the connector and the first electrode or second electrode may be one involving contact with the upper face, lower face, side face, etc., of the first electrode or second electrode, or the connector may be formed integrally (that is, by the same layer) with the first electrode and second electrode.

The connector may be disposed on the groove between the light emitting element components and on the light emitting element component in order to connect the electrodes of the light emitting element components. In this case, the connector is usually disposed via an insulating film. Therefore, "connector" refers to a member disposed on an insulating film.

In plan view, the connector will sometimes have a straight portion running from the first protrusion toward the second light emitting element component. Alternatively, in plan view the connector will sometimes include a first connector that includes a straight portion running from the first protrusion provided to a corner of the first light emitting element component toward the corner of the second light emitting element component which is disposed obliquely to the first light emitting element component.

The first connector is disposed straddling a groove that exposes the substrate surface, between the first protrusion and the second light emitting element component, or between the first protrusion and the corner of the second light emitting element component, or between the first protrusion and the second protrusion. Accordingly, the first connector has a shape that conforms to the convex portions on the substrate surface between these. In other words, the first connector has a surface with concavities and convexities corresponding to the convex portions on the substrate surface, between the first protrusion and the second light emitting element component, or between the first protrusion and the corner of the second light emitting element component, or between the first protrusion and the second protrusion.

As discussed above, the first connector connects two light emitting element components, including the straight portion running from the first protrusion toward the second light emitting element component. Alternatively, the first connector connects obliquely disposed light emitting element components, including the straight portion running from the first protrusion toward the corner of the second light emitting element component. Alternatively, the first connector includes the straight portion running from the first protrusion toward the second protrusion.

The connector may include a second connector that connects two light emitting element components that are adjacent in the column direction or the row direction, in addition to the first connector.

The second connector is disposed straddling the groove that exposes the substrate surface, between two light emitting element components that are adjacent in the column direction or the row direction. Therefore, the second connector will sometimes have a shape that conforms to the convex portions on the substrate surface between these. In other words, the second connector will sometimes have a surface with concavities and convexities corresponding to the convex portions on the substrate surface.

In one embodiment, the connector preferably has a part that extends substantially perpendicular to the extension direction of the first electrode or second electrode (see 24 and 26 in 10*c* of FIG. 1A, and 24 and 27*a* in 10*a* of FIG. 9A). This suppresses an increase in drive voltage caused by wiring resistance.

In another embodiment, the connector is preferably wider than the first electrode or the second electrode. This can avoid discontinuity of the wiring caused by step coverage of the connector. The part of the connector that is wider than the first electrode or the second electrode may become wider in stages (see 87*a*, 87*b*, 86*c*, and 86*d* in FIG. 8A). The wider part of the connector is preferably disposed above the groove (that is, at a location straddling the groove), and especially above the wider groove. An example of "wider" here is a width that is 130 to 500% of the width at other locations (that is, the narrowest part disposed on the first semiconductor layer and second semiconductor layer). This wider part of the connector increases the cross sectional area of the connector, which moderates the current density. Consequently, electromigration of the connector material, which can occur as a result of concentration of current density, can be effectively prevented.

The connector is preferably connected to the long side of the first electrode or second electrode. In other words, in a shape that is elongated in one direction, the connector is preferably connected to the surface of the top face, side face, etc., of the first electrode and second electrode including this elongation line (long side).

As discussed above, "connector" refers to a member that is disposed on an insulating film and is not connected with the first semiconductor layer and second semiconductor layer, and "first electrode" and "second electrode" refer to what is electrically connected to the first semiconductor layer or second semiconductor layer over these semiconductor layers. Therefore, to describe this through reference to FIG. 7A, in the vicinity Q of connection locations between an electrode and a connector in light emitting element components 70*a*, 70*b*, and 70*c*, the connector 27 is connected to the long side of the second electrode 24 which has a slender shape, the second connector 76*b* is connected to the long side of the slender second electrode 24, and the second connector 76*c* is similarly connected to the long side slender second electrode 24.

Figure 7A:
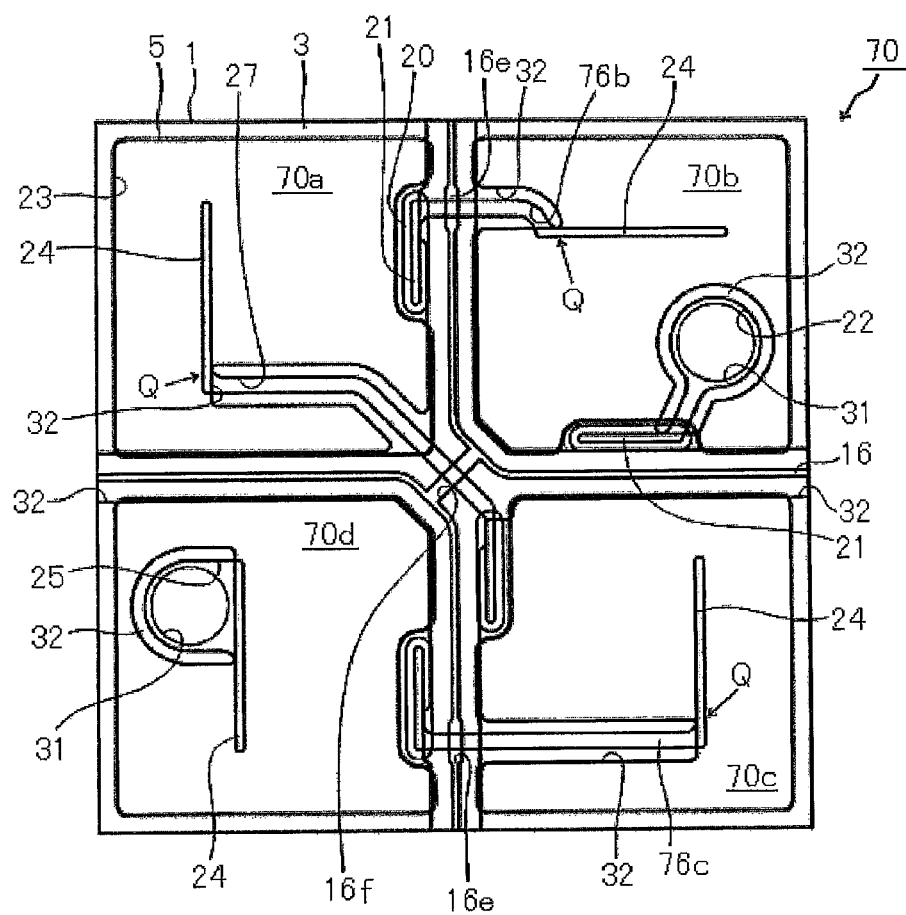
FIG. 7A is a simplified plan view of another embodiment of the semiconductor light emitting element of the present invention.
Figure 7B:
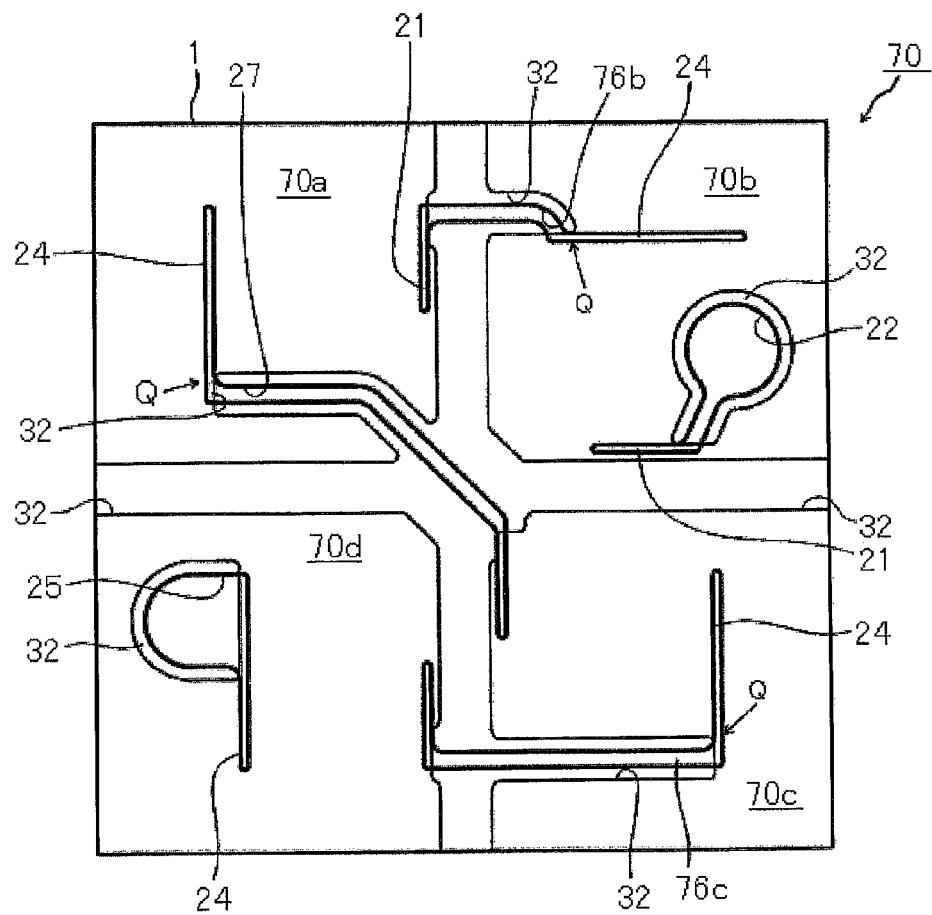
FIG. 7B is a simplified plan view of selected portion of the semiconductor light emitting element in FIG. 7A.

Consequently, as indicated by the vicinity Q of connection locations between an electrode and a connector in FIGS. 1A, 7A, and 7B, the location where the width suddenly changes from the connector to the second electrode, etc., can be moved away from the edge of the insulating film that defines the boundary between the connector and the electrode, rather than being the location where the narrowest parts of the two are connected. Therefore, even if there is an increase in current density at the place where the width suddenly changes, there will be no step at the edge of the insulating film directly underneath, so discontinuity of the wiring can be effectively prevented.

The connector can be formed from the same material as the first electrode and second electrode.

There are no particular restrictions on the thickness of the connector, but 500 nm or more is preferable, and 1 µm or more is more preferable. The thickness of the connector is also preferably no more than a few microns. In other words, the film is preferably thick enough to sufficiently cover the concavities and convexities on the substrate surface discussed above. A thickness within this range will allow a larger margin with respect to discontinuity, and allow the shape to conform to the convex portions on the substrate surface.

First External Connecting Electrode and Second External Connecting Electrode

To make an external connection, the semiconductor light emitting element has at least one pair of a first external connecting electrode and a second external connecting electrode. The first external connecting electrode and the second external connecting electrode are electrodes that function to supply current to the semiconductor layer from the outside.

One each of the first external connecting electrode and the second external connecting electrode may be provided, or two or more of one or the other, or two or more of each may be provided. If there is a pair, the reduction in emission strength can be kept to a minimum better than when the first external connecting electrode and the second external connecting electrode are each provided to an individual light emitting element component.

The first external connecting electrode and the second external connecting electrode are preferably formed wider than the first and second electrodes in order to ensure the surface area required for connecting with an external component, such as wire bonding, etc., as with a so-called pad electrode.

The shape of the first external connecting electrode and second external connecting electrode may be circular, polyhedral, or any other shape that allows connection with the outside. A semicircular shape or substantially semicircular shape may also be used, as with the second external connecting electrode 25 in FIG. 1A. This allows uniform current to be diffused from the linear portion of the substantially semicircular shape of the external connecting electrodes, without having current concentrated at the connected portion of the first external connecting electrode and the first electrode, or the second external connecting electrode and the second electrode.

The material of the first external connecting electrode and the second external connecting electrode preferably has a single-layer or laminated structure of Ni, Ti, Cr, Al, or an alloy of these. It is particularly preferable if a material that can ensure good ohmic properties and good adhesiveness with the first translucent electrode and/or second translucent electrode and the first semiconductor layer and/or second semiconductor layer, is disposed at a layer or location in contact with these. It is especially good to use a multilayer film in which Ti/Rh/Au is laminated from the translucent electrode or semiconductor layer side.

The first external connecting electrode and second external connecting electrode can be formed together with the above-mentioned first electrode and second electrode, and the connectors, integrally as the same laminated structure.

The second external connecting electrode is preferably electrically connected to the second semiconductor layer and/or the second electrode at one or more of the plurality of light emitting element components. There are no particular restrictions on this connection mode, and the second external connecting electrode may be disposed on the second electrode, or the two may be in parallel on the translucent electrode and connected at the side face thereof, or the second electrode and the second external connecting electrode may be formed integrally.

The first external connecting electrode is preferably electrically connected to the first external connecting electrode and/or the first electrode at one or more of the plurality of light emitting element components. There are no particular restrictions on this connection mode, but the first external connecting electrode may be disposed on the first electrode, or the two may be in parallel on the translucent electrode and connected at the side face thereof, or the first electrode and the first external connecting electrode may be formed integrally.

Figure 3:
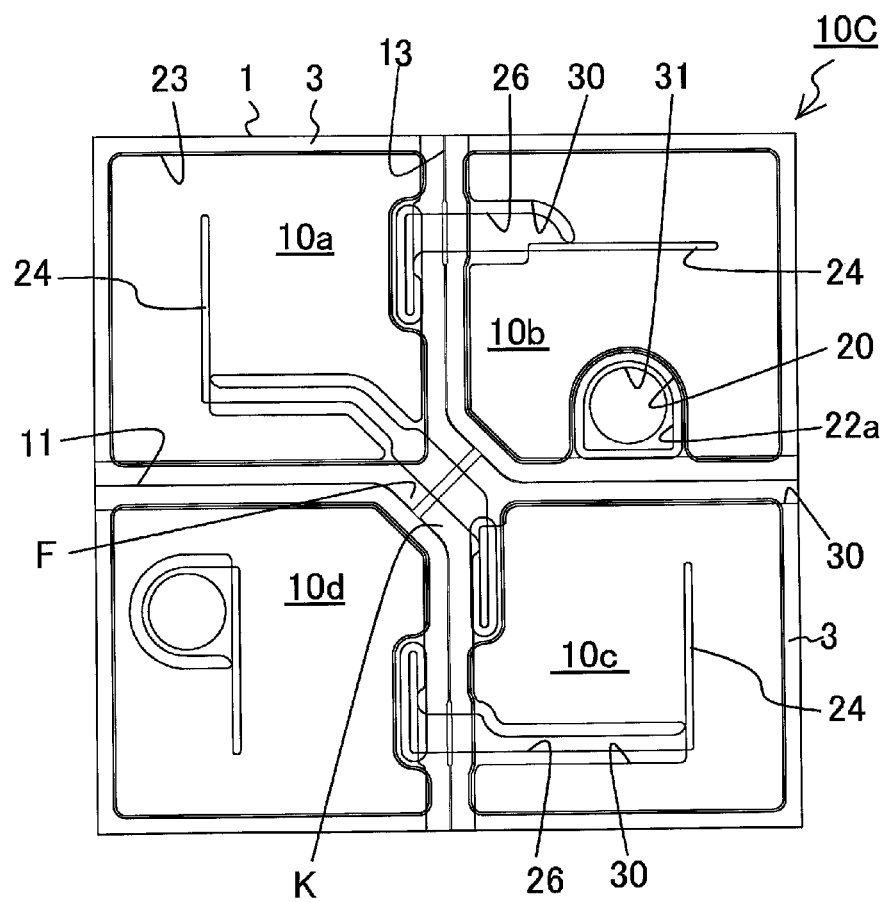
FIG. 3 is a simplified plan view of yet another embodiment of the semiconductor light emitting element of the present invention.

In an embodiment, the exposed portion is expanded by a surface area corresponding to the first external connecting electrode, and the first external connecting electrode is disposed integrally with the first electrode on the exposed portion (see 10b in FIG. 3). In this case, the first external connecting electrode is connected on the first semiconductor layer. Therefore, the second semiconductor layer and active layer present on the first semiconductor layer are removed. As a result, the surface area is reduced at the light emitting element components of the active layer.

In another embodiment, the first external connecting electrode is electrically connected to the first semiconductor layer via the first electrode at one or more light emitting element components that are different from the light emitting element components included by the second external connecting electrode, and is disposed above the second translucent electrode via an insulating film (see 10b in FIG. 1A). When the first external connecting electrode is thus disposed above the second translucent electrode, the above-mentioned removed surface area of the second semiconductor layer and the active layer can be the minimum surface area for making an electrical connection. Thus, the reduction of the emission surface area can be suppressed. As a result, light extraction in a single semiconductor light emitting element can be increased. Also, the active layers in the various light emitting element components can have the same surface area, and uniform emission can be ensured.

For example, when the electrodes are in serial connection, the surface area of the active layer of the light emitting element component where the first external connecting electrode is provided on the first semiconductor layer is less than the surface area of the active layers in the other light emitting element components. Therefore, the forward current If of all the light emitting element components will be the same, except that the light emitting element components in which the surface area of the active layer is smaller tend to be a higher current density and a higher forward voltage Vf. Consequently, the load on the light emitting element components in which the surface area of the active layer is smaller will be higher than that of the other light emitting element components, and there is the risk that the light emitting element components in which the surface area of the active layer is smaller will deteriorate more quickly. Meanwhile, if the first electrode is connected on the first semiconductor layer along with the first external connecting electrode, fine wiring will be unnecessary, and local concentration of current, etc., can be prevented.

If the active layers of the various light emitting element components are all given substantially the same surface area, the load on the various light emitting element components will be uniform, and both light extraction and reliability can be enhanced.

Also, even when the electrodes are connected in parallel, making the surface area substantially the same in the active layers of the various light emitting element components stabilizes Vf and If, striking a good balance between the two and allowing emission to be made uniform efficiently.

The first external connecting electrode and second external connecting electrode may be disposed in the same light emitting element component, or they may be disposed in different light emitting element components. The first external connecting electrode and second external connecting electrode are preferably disposed on the same side of the semiconductor laminated body with respect to the substrate.

In another embodiment, the first external connecting electrode does not necessarily have to be disposed in a light emitting element component, and may be disposed on the same substrate on which the light emitting element components are formed. In this case, part of the first semiconductor layer, active layer, and second semiconductor layer may be removed, or these semiconductor layers may all be laminated, but preferably they are disposed via an insulating film.

Insulating Film

The semiconductor light emitting element preferably includes an insulating film between the light emitting element components and at least directly under the connector in order to insulate the connector from the semiconductor laminated body. It is particularly preferable to use an insulating film that covers the above-mentioned groove, the side face of the semiconductor laminated body adjacent to this groove, and the semiconductor laminated body directly under the connector. In other words, an insulating film preferably covers the area other than the connecting portion between the first electrode and second electrode and the semiconductor layers of the various light emitting element components. This coverage by the insulating film ensures complete insulation of an area other than the connecting portion between at the connector and the first and second electrodes. The "groove" here refers to substantially the entire surface of the bottom face and side face. The side face of the semiconductor laminated body adjacent to the groove refers to the side face of the exposed portion adjacent to the groove (that is, the first semiconductor layer), and also substantially the entire surface of the side face of the semiconductor laminated body adjacent to the exposed portion where the groove is formed. The semiconductor laminated body directly under the connector is the upper face of the first semiconductor layer or second semiconductor layer, and refers to substantially the entire surface of the location where the connector is disposed, but preferably includes what is directly under the connector and the surrounding area.

The insulating film is preferably disposed so that the edge disposed on the semiconductor laminated body is away from the location where the width thereof changes (hereinafter also referred to as the change portion) and near the location where the connector is connected to the first electrode or second electrode (see Q in FIGS. 1A, 7A, and 7B). In general, at an electrode or wiring, current is more likely to concentrate at the location where the width changes, and this may lead to discontinuity. Discontinuity is even more apt to occur when there is a step at this change location. Therefore, to effectively prevent wiring discontinuity, it is preferable for at least part of the edge of the insulating film not to be disposed directly under the change location on the semiconductor laminated body, and even better for all of the edges of the insulating film not to be disposed there. An example of the change location here is the location where the width changes within a range of 30 to 500% of the other width.

As long as insulation can be ensured, the insulating film may be made of any material and have any thickness, but examples include oxides, nitrides, fluorides, and the material is preferably translucent. In particularly, the insulating film can be formed of a single-layer or a laminated structure of oxides, nitrides, fluorides of Si, Al, Nb, Zr, Ti and the like.

In the case of a single layer, it is particularly preferable to use $SiO_2$ as this material.

To ensure reflectivity, the film thickness is preferably at least $3\lambda/(4n)$ (at least approximately 230 nm in the case of an InGaN-based light emitting element that emits blue light). $\lambda$ here is the emission wavelength of the semiconductor light emitting element, and n is the refractive index of each layer.

In the case of a multilayer structure, two more materials with different refractive indexes are preferably laminated. For instance, a multilayer laminate may be produced using $SiO_2$ as a low-refractive index material and $Nb_2O_5$ as a high-refractive index material. Using a multilayer structure such as this not only affords higher reflection of the emission wavelength, but also imparts wavelength selectivity. When wavelength selectivity is imparted, a structure can be obtained in which the emission wavelength of the semiconductor light emitting element is transmitted, and as discussed below, the emission of a phosphor formed at the upper part of the semiconductor light emitting element is reflected. As a result, light of the desired wavelength can be extracted more efficiently.

In the case of a multilayer film composed of two or more materials with different refractive indexes, the thickness of each layer preferably satisfies $0.3\lambda/(4n)$ to $\lambda/n$.

Protective Film

In one embodiment, the semiconductor light emitting element of the present invention is preferably such that the entire surface other than the region connected to the outside is covered by a protective film. Examples of this protective film are the same as those given for the insulating film above. There are no particular restrictions on the thickness, which can be suitably adjusted within a range of a few nanometers to a few hundred microns. This protective film may be a film produced by ALD (atomic layer deposition), for example.

In one embodiment, the semiconductor light emitting element of the present invention can be used as a semiconductor light emitting device by sealing it with a sealing member that is known in this field. In this case, the member constituting the sealing member preferably contains a phosphor in a translucent member, lens, or the like that covers the emission face. This allows light of the desired wavelength band to be extracted. Any phosphor that is used in this field can be used here.

Working examples of the semiconductor light emitting element of the present invention will now be described in detail through reference to the drawings.

Embodiment 1

The semiconductor light emitting element of Embodiment 1 is shown in FIGS. 1A to 1E. In FIGS. 1A to 1E, however, for the sake of the description, the convex portions on the substrate surface discussed below are omitted in FIGS. 1A to 1C and 1F, and shown only in FIGS. 1D and 1E, and are exaggerated in FIG. 1D. FIG. 1G is a cross section along the B-B' line in FIG. 1F, which is a plan view just as is FIG. 1A, in order to clarify the cut location in the plan view of the semiconductor light emitting element shown in FIG. 1A.

This semiconductor light emitting element 10 has four light emitting element components 10a to 10d, which are substantially square in shape, on a sapphire substrate 1.

Figure 1D:
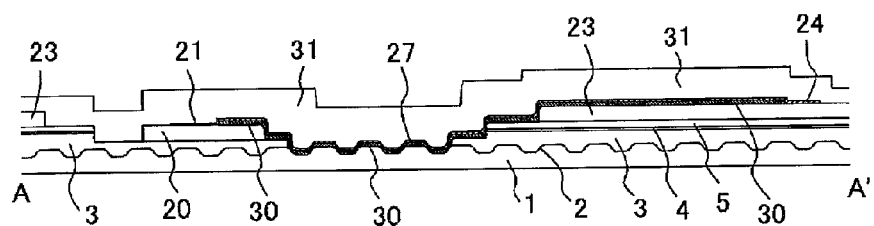
FIG. 1D is an A-A' cross section of the semiconductor light emitting element in FIG. 1A.
Figure 1E:
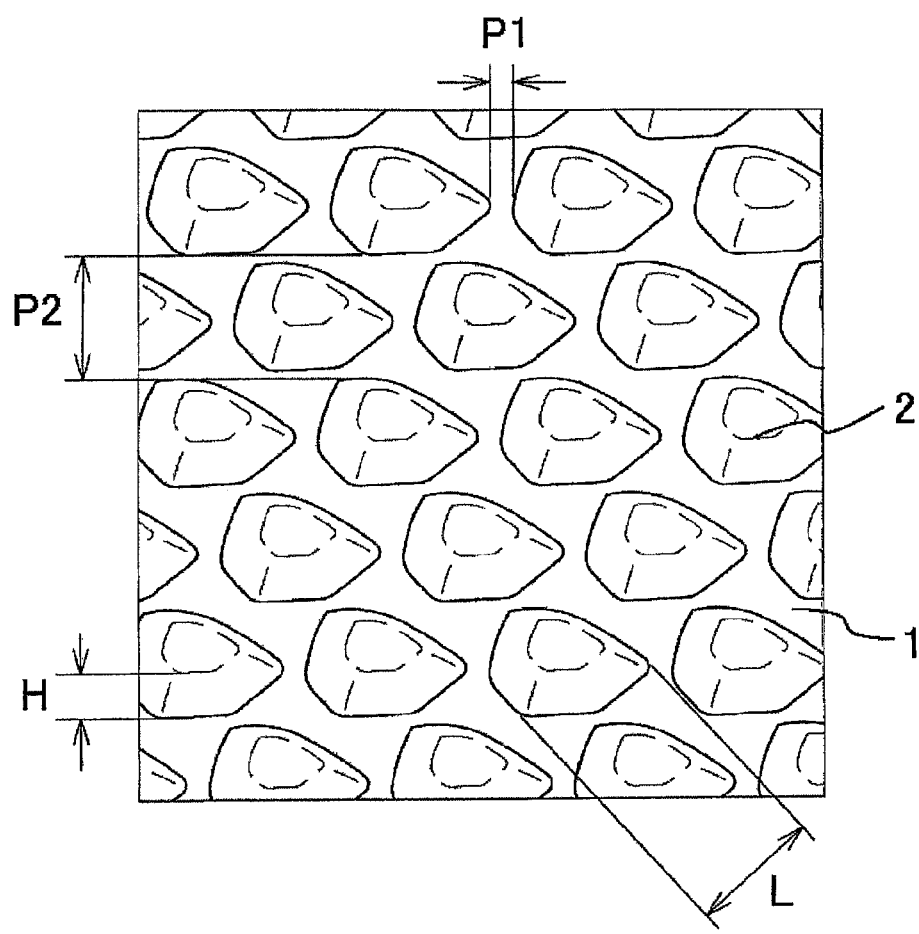
FIG. 1E is an oblique view of the substrate surface of the semiconductor light emitting element in FIG. 1A.
Figure 1F:
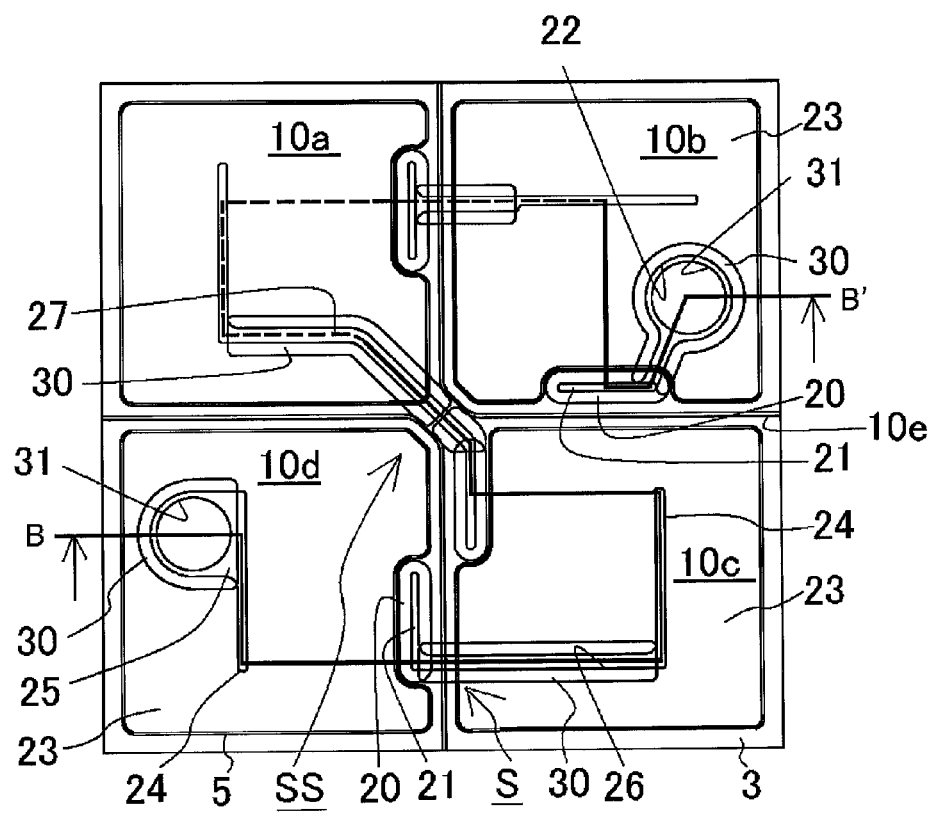
FIG. 1F is a simplified plan view of the same semiconductor light emitting element as in FIG. 1A showing a B-B' cross section.
Figure 1G:
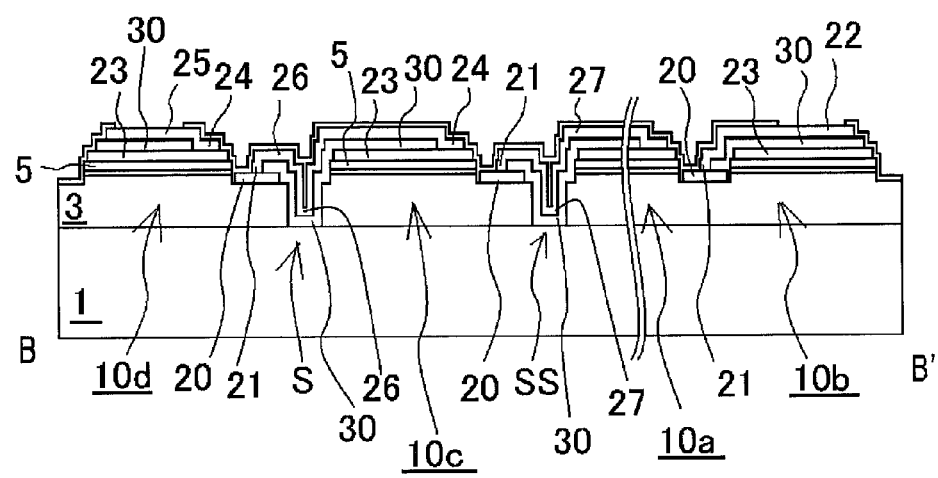
FIG. 1G is a B-B' cross section of FIG. 1F.

As shown in FIGS. 1D and 1E in particular, the sapphire substrate 1 has a plurality of convex portions 2 on its surface. The convex portions 2 here are such that the basic shape of their bottom face is that of a regular triangle, the sides of which are rounded to form an outward bulge, and the convex portions 2 have a frustum or prismoid shape. The length L of one side is 3 μm, the distance between convex portions (the pitch P1) is 1 μm, the distance between convex portions (the pitch P2) is 2.5 μm, and the height H is 1 μm.

The light emitting element components 10a to 10d are disposed in a 2×2 matrix in which the sides are opposite each other in the column direction and the row direction.

These light emitting element component 10a are formed by a semiconductor laminated body in which a first semiconductor layer 3 (such as an n-side semiconductor layer), an active layer 4, and a second semiconductor layer 5 (such as a p-side semiconductor layer) are formed in that order on the sapphire substrate 1 (see FIG. 1D).

The semiconductor laminated body is completely removed between the light emitting element components 10a to 10d, and the light emitting element components 10a to 10d are separated from one another by grooves 10e that expose at least part of the convex portions 2 on the surface of the sapphire substrate 1. The width of these grooves 10e is a constant width N over the entire length (FIG. 1C in particular), and is 3 μm, for example.

In other words, in plan view the grooves 10e include grooves that surround and conform to the corners of the two light emitting element components 10b and 10d that are opposite diagonally, and a groove that linearly links these two grooves. These grooves 10e form an H shape in plan view. Where the grooves 10e are opposite the four corners of the light emitting element components 10a to 10d, there is no wider portion such as in the center of a cross shape, and the specific width N is maintained (FIG. 1C in particular).

With the grooves 10e thus shaped, the light emitting element component 10c is such that its corner on the light emitting element component 10a side which is diagonally opposite has a first protrusion K (FIG. 1C in particular) that protrudes to the light emitting element component 10a side. The corner of the light emitting element component 10a has a second protrusion F (FIG. 1C in particular) that protrudes to the light emitting element component 10c side. The distance between the first protrusion K and the second protrusion F (that is, the width N of the groove 10e) is 3 μm, for example. The length of the protrusion is 10 to 20 μm, for example. The length of the protrusion here shall be the shortest distance from the corner end of the light emitting element component 10a corresponding to the corner end of the light emitting element component 10b to the protruding end.

The light emitting element components 10a to 10d each have an exposed portion where part of the p-side semiconductor layer 5 and the active layer 4 is removed to expose the n-side semiconductor layer 3, respectively. These exposed portions are disposed so as to entirely surround the light emitting element components 10a to 10d, respectively. Because of this disposition of the exposed portions, the above-mentioned first protrusion K and second protrusion F are formed by the exposed portions. Also, the light emitting element components 10a to 10d are such that wider exposed portions M are disposed in part of the inside of the semiconductor light emitting element 10 for connection with first electrodes 21 discussed below, respectively. The wider exposed portions M of the light emitting element components 10a, 10b, and 10d are disposed along the approximate middle of one side opposite the adjacent light emitting element component, and at the light emitting element component 10c, the wider exposed portion M is disposed at the end of one side opposite the adjacent light emitting element component 10a.

This layout of the exposed portions allows the emission surface area of the light emitting element components 10a to 10d to be made substantially the same. This is because the surface areas of the active layers of the four light emitting element components can be made the same by adjusting the width and size of the exposed portions.

An n-side translucent electrode 20 (as a first translucent electrode) and a p-side translucent electrode 23 (as a second translucent electrode) are respectively disposed so as to make an ohmic connection on the p-side semiconductor layer 5 and the n-side semiconductor layer 3 exposed on the inside of the semiconductor light emitting element 10. The p-side translucent electrode 23 is formed in a size and shape that cover substantially the entire surface of the p-type semiconductor layer 5.

The n-side electrode 21 (as a first electrode) and the p-side electrode 24 (as a second electrode) are respectively disposed on and electrically connected to the n-side translucent electrode 20 and the p-side translucent electrode 23. The n-side electrode 21 and the p-side electrode 24 are respectively formed so as to extend substantially parallel to the side of the light emitting element component.

The light emitting element component 10b further has a first external connecting electrode 22 that is connected to the n-side electrode 21 and is disposed overlapping from the n-side electrode 21 to the p-side translucent electrode 23.

The first external connecting electrode 22 has, for example, a pad portion with a circular or polyhedral shape having a surface area sufficient for wire bonding, and an extension portion that extends from there toward the n-side electrode 21. The extension portion is wider than the n-side electrode 21, for example, and has about the same width as the first connector 27 and the second connector 26 (discussed below). This shape prevents discontinuity near the pad portion of the extension portion where a large amount of current flow in from the pad portion.

An insulating film 30 composed of $SiO_2$ (for example, thickness of 500 nm) is disposed under the first external connecting electrode 22, except where it is connected to the n-side electrode 21. This insulating film 30 has a shape that is wider than the first external connecting electrode 22 under the first external connecting electrode 22. This reliably prevents short circuiting of the first external connecting electrode 22. Also, the first external connecting electrode 22 is formed wider than the n-side electrode 21. This prevents discontinuity at a step between grooves, etc.

This insulating film 30 has a certain amount of variance in its thickness on the convex portions 2 of the substrate surface, at the side faces of the convex portions 2, and between the convex portions 2. As discussed above, however, because the grooves 10e are extremely narrow in width, parts where there is variance in the thickness of the insulating film can be kept to a minimum, thereby effectively preventing discontinuity at the step location.

Thus, with the light emitting element component 10b, the first external connecting electrode 22 is disposed not on the n-side semiconductor layer 3, but on the p-side semiconductor layer 5, which keeps to a minimum the exposed surface area of the n-side semiconductor layer 3. As a result, the emission surface area of the active layer 4 in the light emitting element component 10b can be increased to the maximum.

Also, when the first external connecting electrode 22 is disposed on the p-side semiconductor layer 5, there is no need to remove the p-side semiconductor layer 5 and the active layer 4 in order to dispose the first external connecting electrode 22, so the emission surface area can be substantially the same as in the light emitting element components 10a and 10c, in which no first external connecting electrode 22 is disposed. As a result, it is possible to keep the emission strength uniform in the various light emitting element components.

Furthermore, this disposition of the first external connecting electrode 22 requires no separate provision of a region for electrode formation in order to make connection with the outside, in addition to the light emitting element components 10a to 10d, so emission efficiency can be improved and the device will take up less space.

The light emitting element component 10d further has the second external connecting electrode 25 that is electrically connected to the p-side electrode 24 and is disposed on the p-side translucent electrode 23. The second external connecting electrode 25 is formed integrally with the p-side electrode 24. The second external connecting electrode 25 is disposed on the p-side translucent electrode 23 via the insulating film 30, without touching the p-side translucent electrode 23.

The four light emitting element components 10a to 10d disposed in a matrix are connected in series by the second connector 26 and the first connector 27.

The second connector 26 is connected to the n-side electrode 21 of the light emitting element component 10a, extends from this n-side electrode 21 over the p-side translucent electrode 23 of the light emitting element component 10b along the surface convex portions of the grooves 10e and straddling the grooves 10e, and is electrically connected to the p-side electrode 24 which is connected to the p-side translucent electrode 23, between the light emitting element components 10a and 10b.

The second connector 26 is such that the insulating film 30 is disposed underneath, except for the part where it is connected to the n-side electrode 21 of the light emitting element component 10a, and the part where it is connected to the p-side electrode 24 of the light emitting element component 10b. This insulating film 30 has a shape that is wider than the second connector 26 under the second connector 26. This prevents unnecessary short circuiting of the second connector 26.

The second connector 26 is connected to the n-side electrode 21 of the light emitting element component 10d, extends from this n-side electrode 21 over the p-side translucent electrode 23 of the light emitting element component 10c along the surface convex portions of the grooves 10e and straddling the grooves 10e, and is electrically connected to the p-side electrode 24 which is connected to the p-side translucent electrode 23, between the light emitting element components 10d and 10c.

The second connector 26 is such that the insulating film 30 is disposed underneath, except for the part where it is connected to the n-side electrode 21 of the light emitting element component 10d, and the part where it is connected to the p-side electrode 24 of the light emitting element component 10b. This insulating film 30 has a shape that is wider (approximately two times wider) than the second connector 26 under the second connector 26. The second connector 26 has a shape that is wider (approximately two times wider) at the part where it straddles the grooves 10e than the width at other parts.

Between the light emitting element components 10a and 10c, which are disposed diagonally, the first connector 27 is connected to the n-side electrode 21 of the light emitting element component 10c, extends from this n-side electrode 21 over the p-side translucent electrode 23 of the light emitting element component 10a so as to straddle the protrusion K, grooves 10e and protrusion F along the surface convex portions of the grooves 10e, from the light emitting element component 10c toward the light emitting element component 10a (that is, diagonally between the light emitting element components), and is electrically connected to the p-side electrode 24 which is connected to the p-side translucent electrode 23.

The first connector 27 is such that the insulating film 30 is disposed underneath, except for the part where it is connected to the n-side electrode 21 of the light emitting element component 10c, and the part where it is connected to the p-side electrode 24 of the light emitting element component 10a. This insulating film 30 has a shape that is wider (approximately two times wider) than the first connector 27 under the first connector 27. The first connector 27 has a shape that is wider (approximately two times wider) at the place where it straddles the grooves 10e than the width at other locations.

In other words, the first connector 27 is disposed so that it intersects (preferably at a right angle) the groove (among the plurality of grooves 10e) that linearly links the grooves surrounding the corners of the two light emitting element components 10b and 10d that are diagonally opposite. At this intersection, the first connector 27 has a surface shape that conforms to the convex portions on the substrate surface, via the insulating film 30.

In this case, the first connector 27 is similar to the insulating film 30 in that it has a certain amount of variance in its thickness on the convex portions of the substrate surface, at the side faces of the convex portions, and between the convex portions. However, as discussed above, the width of the grooves can be kept extremely narrow by disposing the first protrusion K and the second protrusion F, so this area of variance in thickness can be kept to a minimum.

The intersection of the first connector 27 and the groove 10e also allows the contact surface area with the first connector 27, which is in contact with the convex portions on the substrate surface via the insulating film 30, to be kept to a minimum. As a result, discontinuity can be effectively prevented at stepped locations.

The first connector 27 includes a straight section from the first protrusion K toward the second protrusion F. This keeps to a minimum the distance at which the groove is straddled, and effectively prevents discontinuity at stepped locations.

The entire surface of this semiconductor light emitting element 10 is covered by a protective film 31, except for the regions on the first external connecting electrode 22 and the second external connecting electrode 25 used for connecting to the outside. This protective film 31 is formed from $SiO_2$ (film thickness: 500 nm), for example.

With this semiconductor light emitting element 10, the occurrence of discontinuity at the connectors and so forth can be prevented when the substrate having convex portions on its surface is used and light emitting element components are connected by using a diagonal connector disposed to conform to the high and low parts of the groove that exposes the convex portions on the substrate surface. This affords uniform and high emission strength.

Embodiment 2

The semiconductor light emitting element in Embodiment 2 is shown in FIG. 2A.

The semiconductor light emitting element 10A in this embodiment is configured the same as the semiconductor light emitting element 10 in Embodiment 1, except that the width of the grooves varies with their location.

With this semiconductor light emitting element 10A, grooves 11 having a relatively narrow width N are disposed between the light emitting element component 10a and the light emitting element component 10d, and between the light emitting element component 10b and the light emitting element component 10c. Grooves 12 having a relatively wide width M are disposed between the light emitting element component 10a and the light emitting element component 10b, and between the light emitting element component 10d and the light emitting element component 10c. Also, a groove having a linear shape and extending diagonally from the light emitting element component 10d to the light emitting element component 10b, that is, the groove where the first connector 27 is disposed, has a relatively wide width G that is about the same as that of the grooves 12. The width N here is 3 µm, and the widths M and G are 10 µm.

By thus reducing the width of the grooves at places not wired between elements, the surface area need for separation can be minimized, and a more compact semiconductor light emitting element can be obtained.

Also, by somewhat increasing the width of the grooves only at places where a diagonal connector is disposed, the connector material adheres better to the groove side faces and bottom faces. As a result, a good balance can be struck with a shape that conforms to the convex portions of the substrate surface, and wiring discontinuity, etc., can be effectively prevented.

The semiconductor light emitting element in this Embodiment 2 has substantially the same effect as that of the semiconductor light emitting element in Embodiment 1.

Embodiment 3

The semiconductor light emitting element in Embodiment 3 is shown in FIG. 2B.

The semiconductor light emitting element 10B in this embodiment is configured the same as the semiconductor light emitting element 10 in Embodiment 1, except that the width of the grooves varies with their location.

With the semiconductor light emitting element 10B in this embodiment, grooves 11 having a relatively narrow width N are disposed between the light emitting element component 10a and the light emitting element component 10d, and between the light emitting element component 10b and the light emitting element component 10c.

Grooves 14, which have a relatively wide width W at the places where the second connector 26 is disposed extending in the column direction, and elsewhere has a relatively narrow width R, are disposed between the light emitting element component 10a and the light emitting element component 10b, and between the light emitting element component 10d and the light emitting element component 10c.

A groove having a linear shape and extending diagonally from the light emitting element component 10d to the light emitting element component 10b, that is, the groove where the first connector 27 is disposed, has a relatively wide width G that is about the same as that of the wide parts of the grooves 14. The width N and R here is 3 µm, and the widths W and G are 10 µm.

By thus reducing the width of the grooves at places not wired between elements, the surface area need for separation can be minimized, and a more compact semiconductor light emitting element can be obtained.

Also, by somewhat increasing the width of the grooves only at places where a diagonal connector is disposed, the connector material adheres better to the groove side faces and bottom faces. As a result, a good balance can be struck with a shape that conforms to the convex portions of the substrate surface, and wiring discontinuity, etc., can be effectively prevented.

The semiconductor light emitting element in this Embodiment 3 has substantially the same effect as that of the semiconductor light emitting element in Embodiment 1.

Embodiment 4

The semiconductor light emitting element in Embodiment 4 is shown in FIG. 3.

The semiconductor light emitting element 10C in this embodiment is configured substantially the same as the semiconductor light emitting elements in Embodiment 1 and 3, except that the width of the grooves 11 and 13 varies with their location just as in Embodiment 3, the shape of the second connector 26 is changed, the insulating film 30 not only is disposed under the second connector 26, but also covers the grooves 11 and 13, the exposed portion of the n-side semiconductor layer 3 is expanded in the light emitting element component 10b, and the first external connecting electrode 22 is connected thereon and serves as a first electrode.

The semiconductor light emitting element 10C in this Embodiment 4 has substantially the same effect as that of the semiconductor light emitting element in Embodiment 1 and Embodiment 3.

Embodiment 5

Figure 4:
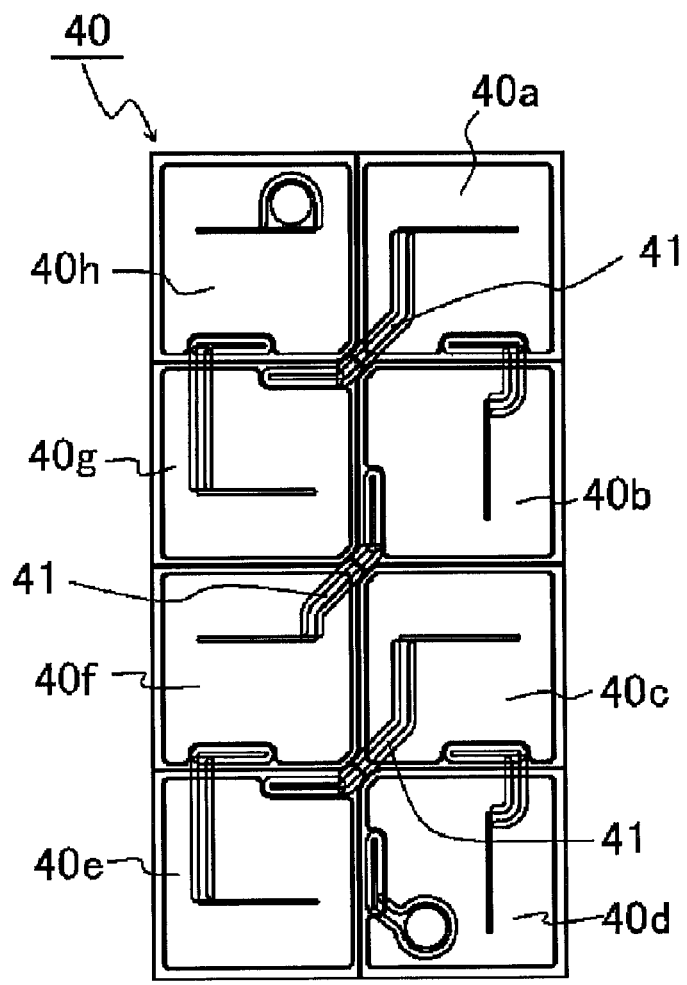
FIG. 4 is a simplified plan view of yet another embodiment of the semiconductor light emitting element of the present invention.

The semiconductor light emitting element 40 in Embodiment 5 is shown in FIG. 4.

The semiconductor light emitting element 40 in this embodiment is configured the same as the semiconductor light emitting element 10 in Embodiment 1, except that eight light emitting element components 40a to 40h are disposed in a 2×4 matrix.

These light emitting element components 40a to 40h are connected in series and have three first connectors 41 that electrically connect diagonally.

With the semiconductor light emitting element in this embodiment, any layout of any number of elements is thus possible, which affords broad design latitude.

The semiconductor light emitting element in this Embodiment 5 has substantially the same effect as that of the semiconductor light emitting element in Embodiment 1.

Embodiment 6

Figure 5:
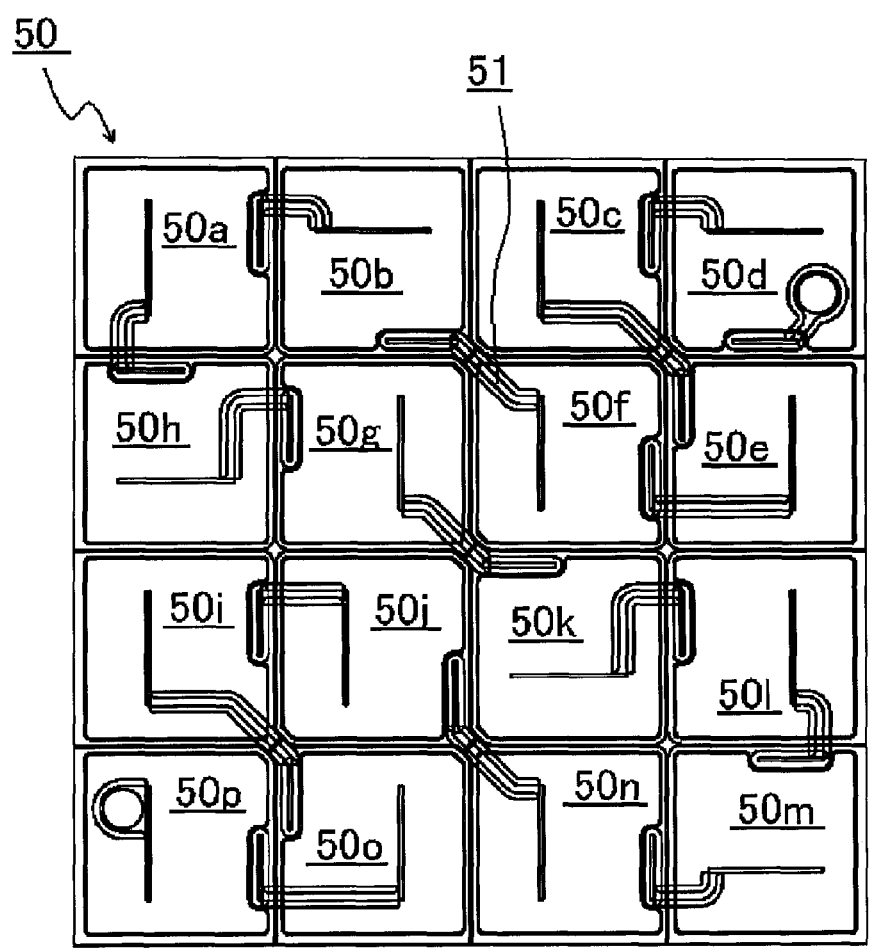
FIG. 5 is a simplified plan view of yet another embodiment of the semiconductor light emitting element of the present invention.

The semiconductor light emitting element 50 in Embodiment 6 is shown in FIG. 5.

The semiconductor light emitting element 50 in this embodiment 6 is configured the same as the semiconductor light emitting element 10 in Embodiment 1, except that sixteen light emitting element components 40a to 40p are disposed in a 4×4 matrix.

These light emitting element components 40a to 40p are connected in series and have five first connectors 51 that electrically connect diagonally.

With the semiconductor light emitting element in this embodiment, any layout of any number of elements is thus possible, which affords broad design latitude.

The semiconductor light emitting element in this Embodiment 6 has substantially the same effect as that of the semiconductor light emitting element in Embodiment 1.

Embodiment 7

The semiconductor light emitting element of Embodiment 7 is shown in FIG. 6.

The semiconductor light emitting element in this embodiment is configured the same as the semiconductor light emitting element 10 in Embodiment 1, except that grooves 15 between diagonally opposite light emitting element components 60a and 60c are disposed along the corner of the light emitting element component 60a, a first semiconductor layer 63 in the light emitting element component 60a does not protrude to the light emitting element component 60c side, and a protrusion E is formed only on the light emitting element component 60c, at the place where the corners of the light emitting element components 60a to 60d are opposite.

The semiconductor light emitting element in this Embodiment 6 has substantially the same effect as that of the semiconductor light emitting element in Embodiment 1.

Embodiment 8

The semiconductor light emitting element 70 of Embodiment 8 is shown in FIGS. 7A and 7B. For the sake of description, however, FIG. 7B is a simplified plan view that only shows an insulating film 32, the first electrode 21, the second electrode 24, the first connector 27, and second connectors 76b and 76c taken from the semiconductor light emitting element 70 shown in FIG. 7A.

With this semiconductor light emitting element 70, as shown in FIG. 7B in particular, the insulating film 32 covers the entire surface of the semiconductor laminated body directly under the second connectors 76b and 76c and the first connector 27, the side faces of the semiconductor laminated body, and grooves 16 and 16e, in a cross shape between four semiconductor light emitting element components 70a, 70b, 70c, and 70d, which are laid out in a matrix. In particular, the insulating film 32 is disposed wider, by approximately 200%, than the width of the first connector 27 and the second connectors 76b and 76c on the semiconductor laminated body directly under the first connector 27 and the second connectors 76b and 76c.

As shown in FIG. 7A, near the place where the first connector 27 and the second connectors 76b and 76c are connected to the second electrode 24 at the light emitting element components 70a, 70b, and 70c, the second connectors 76b and 76c are connected to the long side of the slender second electrode 24. In other words, on the semiconductor laminated body and near the place where the second connector 76b and the second electrode 24 are connected (Q in FIGS. 7A and 7B), part of the edge of the insulating film 32 is disposed away from the place where the width of the insulating film 32 changes.

Consequently, the place where the current density increases, from the second connector 76b to the second electrode 24, does not overlap with the place where there is a step due to the insulating film 32, so discontinuity can be effectively prevented.

The semiconductor light emitting element in this embodiment 8 is configured the same as the semiconductor light emitting elements 10 and 10B in Embodiments 1 and 3, except for the above. Therefore, the semiconductor light emitting element 70 in this Embodiment 8 has substantially the same effect as that of the semiconductor light emitting elements 10 and 10B in Embodiments 1 and 3.

Embodiment 9

Figure 8A:
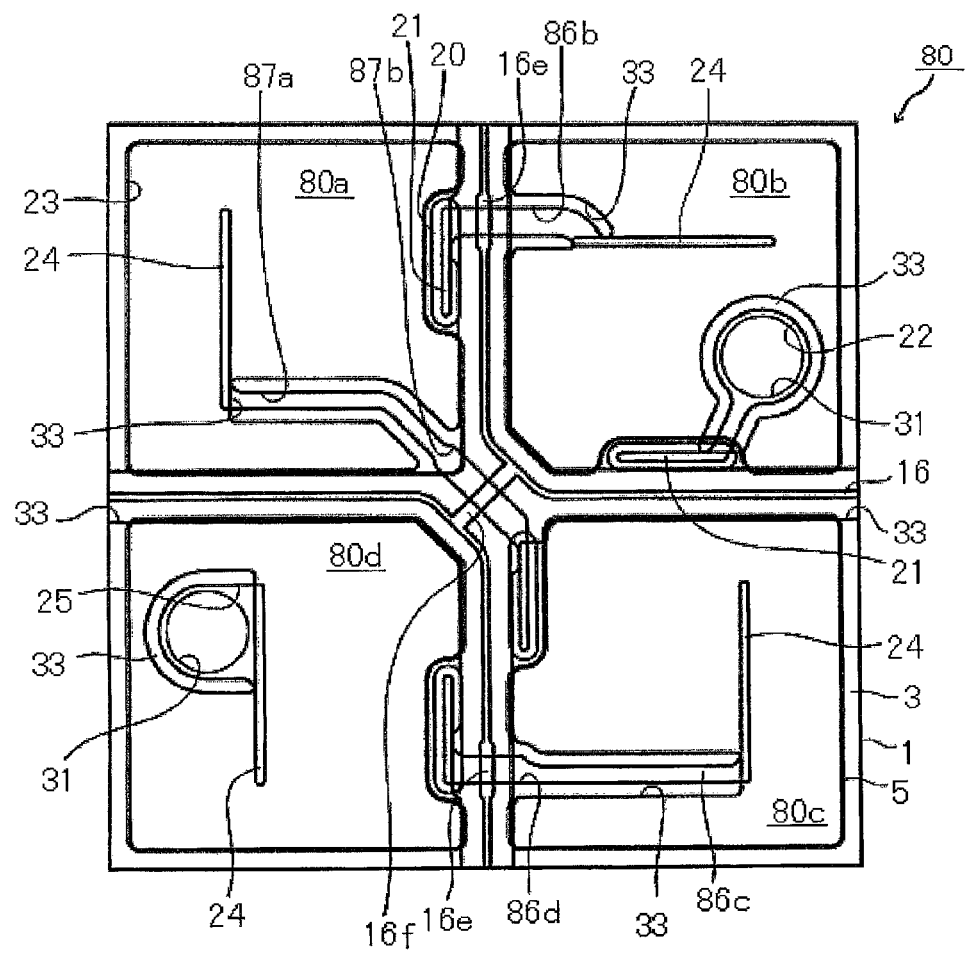
FIG. 8A is a simplified plan view of yet another embodiment of the semiconductor light emitting element of the present invention.
Figure 8B:
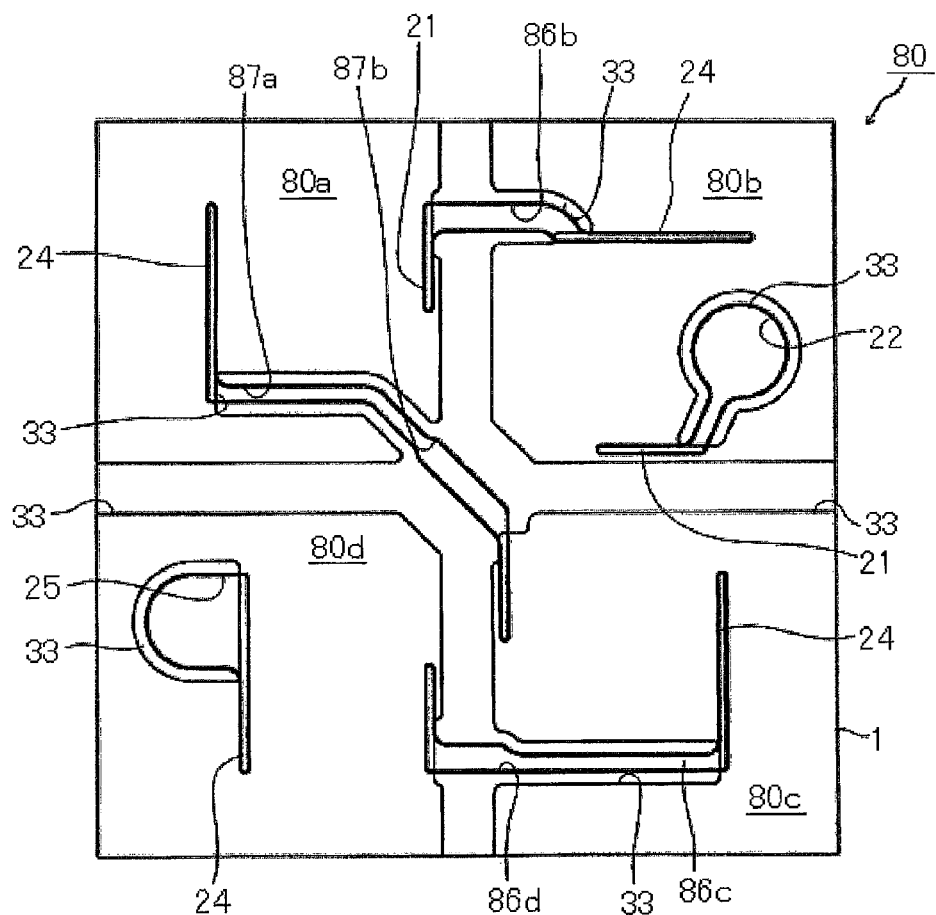
FIG. 8B is a simplified plan view of selected portion of the semiconductor light emitting element in FIG. 8A.

The semiconductor light emitting element 80 of Embodiment 9 is shown in FIGS. 8A and 8B. For the sake of description, however, FIG. 8B is a simplified plan view that only shows an insulating film 33, the first electrode 21, the second electrode 24, first connectors 87a and 87b, and second connectors 86b, 86c, and 86d taken from the semiconductor light emitting element 80 shown in FIG. 8A.

With this semiconductor light emitting element 80, as shown in FIG. 8B in particular, the insulating film 33 covers the entire surface of the semiconductor laminated body directly under the first connectors 87a and 87b and second connectors 86b, 86c, and 86d, the side faces of the semiconductor laminated body, and grooves 16 and 16e, in a cross shape between four semiconductor light emitting element components 80a, 80b, 80c, and 80d, which are laid out in a matrix. In particular, the insulating film 33 is disposed wider than the width of the first connectors 87a and 87b and second connectors 86b, 86c, and 86d on the semiconductor laminated body directly under the first connectors 87a and 87b and second connectors 86b, 86c, and 86d.

Also, the first connector 87b and the second connectors 86b and 86d are even wider over the grooves 16e and 16f and nearby than at other places. As discussed above, this stepwise change in the width at certain places of the connectors increases the cross sectional area of the connectors and moderates the current density, which effectively reduces electromigration. Also, the decrease in optical output that accompanies an increase in the width of the connectors can be kept to a minimum by minimizing the shielding region produced by the connectors on the active layer.

The semiconductor light emitting element in this embodiment 9 is configured the same as the semiconductor light emitting elements 10, 10B and 70 in Embodiments 1, 3 and 8, except for the above.

Therefore, the semiconductor light emitting element 80 in this Embodiment 9 has substantially the same effect as that of the semiconductor light emitting elements 10,10B and 70.

Embodiment 10

The semiconductor light emitting element 90A of Embodiment 10 is shown in FIG. 9A.

This semiconductor light emitting element 90A has two light emitting element components 10a and 10b that have a rectangular shape.

The light emitting element components 10a and 10b are separated from one another by a groove 10f. This groove 10f has a wide section and a narrow section, and the width P at the widest section is 45 μm, while the width S at the narrowest section is 5 μm, for example. This groove 10f demarcates a first protrusion H and a second protrusion J that protrude toward the light emitting element components 10a and 10b, between the light emitting element components 10a and 10b. The length of the protrusions is 5 to 40 μm and the width is 70 μm, for example. The first protrusion H and the second protrusion J need not have the same length. That is, the length may be suitably adjusted so that one is longer and the other shorter.

The narrow section of the groove 10f is straight, and is disposed so as to be perpendicular to the first protrusion H and the second protrusion J.

The p-side electrode 24 and the n-side electrode 21 are each slender in shape and are disposed parallel to each other.

A first connector 27a is disposed between the light emitting element components 10a and 10b. The first connector 27a straddles the first protrusion H and the second protrusion J, and has a straight section going from the first protrusion H to the second protrusion J along the surface of the substrate. The first connector 27a is connected to the p-side electrode 24 and the n-side electrode 21 so as to be substantially perpendicular to these electrodes in the middle portion of these electrodes.

The semiconductor light emitting element in this embodiment 10 is configured the same as the semiconductor light emitting element 10 and the like in Embodiment 1 and the like, except for the above.

Therefore, the semiconductor light emitting element 90A in this Embodiment 10 has substantially the same effect as that of the semiconductor light emitting element 10 and the like.

Embodiment 11

The semiconductor light emitting element 90B of Embodiment 11 is shown in FIG. 9B.

This semiconductor light emitting element 90B is configured substantially the same as the semiconductor light emitting elements in Embodiments 4 and 10, except that the exposed portion of the n-side semiconductor layer 3 is expanded at the light emitting element component 10a, and a first external connecting electrode 22a is connected over this and serves as a first electrode.

The semiconductor light emitting element 90B in this Embodiment 11 has substantially the same effect as that of the semiconductor light emitting elements in Embodiment 1, 4 and 10.

Embodiment 12

The semiconductor light emitting element 90C of Embodiment 12 is shown in FIG. 9C.

This semiconductor light emitting element 90C is configured substantially the same as the semiconductor light emitting element in Embodiment 10, except that the narrow section of a groove 10g separating the light emitting element components 10a and 10b is disposed adjacent to the light emitting element component 10b, and a first protrusion E that produces toward the light emitting element component 10b side is thus demarcated at the light emitting element component 10a.

Therefore, the semiconductor light emitting element 90C in this Embodiment 12 has substantially the same effect as that of the semiconductor light emitting elements 10 and 90A.

Embodiment 13

Figure 9D:
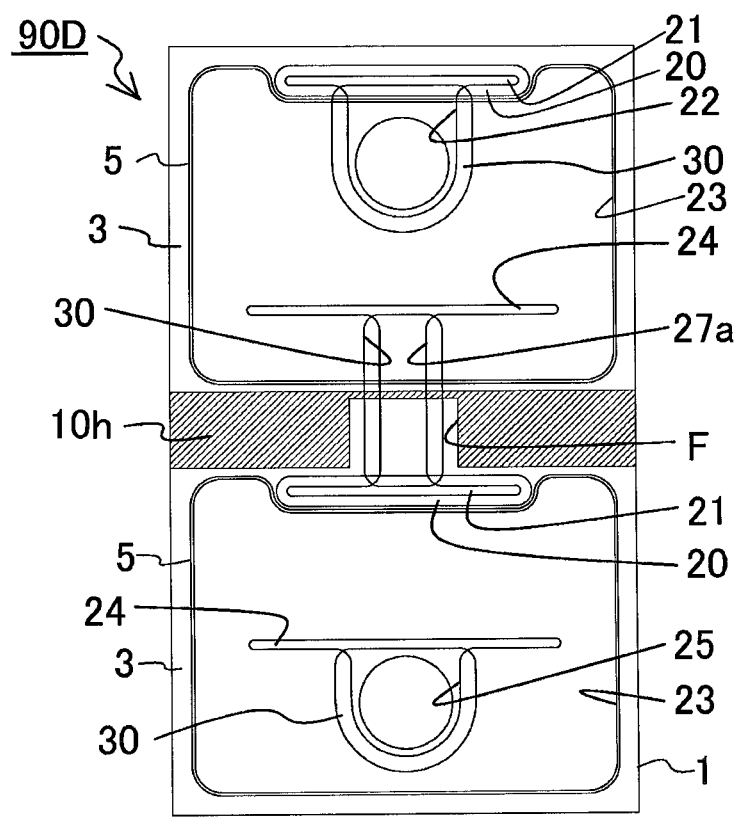
FIG. 9D is a simplified plan view of yet another embodiment of the semiconductor light emitting element of the present invention.

The semiconductor light emitting element 90D of Embodiment 13 is shown in FIG. 9D.

This semiconductor light emitting element 90D is configured substantially the same as the semiconductor light emitting elements in Embodiments 10 and 12, except that the narrow section of a groove 10h separating the light emitting element components 10a and 10b is disposed adjacent to the light emitting element component 10a, and a second protrusion F that produces toward the light emitting element component 10a side is thus demarcated at the light emitting element component 10b.

Therefore, the semiconductor light emitting element 90D in this Embodiment 13 has substantially the same effect as that of the semiconductor light emitting elements 10, 90A, 90C and the like.

The light emitting device according to the illustrated embodiments can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor light emitting element comprising:
    an insulating substrate having a plurality of convex portions on a surface thereof;
    a plurality of light emitting element components having semiconductor laminated bodies that are laminated on the insulating substrate and are separated from one another by a groove that exposes the convex portions on the surface of the insulating substrate; and
    a connector connecting between the light emitting element components,
    the light emitting element components including a first light emitting element component and a second light emitting element component,
    the first light emitting element component being separated from the second light emitting element component with the groove in between, and having a first protrusion that protrudes toward the second light emitting element component, and
    the connector including a first connector having a shape that straddles the groove separating the first protrusion and the second light emitting element component and that follows the convex portions on the surface of the insulating substrate, and has a straight section extending from the first protrusion toward the second light emitting element component in plan view.

2. The semiconductor light emitting element according to claim 1, wherein
    the first light emitting element component and the second light emitting element component are quadrangular in plan view.

3. The semiconductor light emitting element according to claim 2, wherein
    the first protrusion protrudes toward a corner of the second light emitting element component at a corner of the first light emitting element component, and
    the first connector extends from the first protrusion toward the corner of the second light emitting element component.

4. The semiconductor light emitting element according to claim 2, wherein
    the light emitting element components are disposed in a matrix in which sides of the light emitting element components in a column direction and a row direction in plan view face each other.

5. The semiconductor light emitting element according to claim 1, wherein
    the first light emitting element component and the second light emitting element component are disposed obliquely in plan view.

6. The semiconductor light emitting element according to claim 2, wherein
    the second light emitting element component has a second protrusion that is disposed at a corner of the second light emitting element and protrudes toward the first protrusion.

7. The semiconductor light emitting element according to claim 2, wherein
    each of the semiconductor laminated bodies includes a first semiconductor layer, an active layer, and a second semiconductor layer laminated in this order, and the first light emitting element component has an exposed portion including the first protrusion where the first semiconductor layer is exposed at a corner of the first light emitting element component, and
    the connector is electrically connected to the first semiconductor layer on the exposed portion.

8. The semiconductor light emitting element according to claim 2, wherein
    the distance from the first protrusion to the corner of the second light emitting element component is the same as the maximum distance between two adjacent light emitting elements in the column direction or the row direction.

9. The semiconductor light emitting element according to claim 4, further comprising
    additional connectors connecting the light emitting element components,
    the additional connectors include a second connector connecting two adjacent ones of the light emitting element components in the column direction or the row direction, and
    a distance between the two adjacent ones of the light emitting element components connected by the second connector is greater than a distance between two adjacent ones of the light emitting element components in the column direction or the row direction that are not connected by the second connector.

10. The semiconductor light emitting element according to claim 1, wherein
    the light emitting element components are arranged in a matrix of having an even number of columns and an even number of rows.

11. The semiconductor light emitting element according to claim 1, further comprising
    an insulating film covering the groove, side faces of the semiconductor laminated bodies adjacent to the groove, and the semiconductor laminated bodies directly under the connector.

12. The semiconductor light emitting element according to claim 1, wherein
    each of the semiconductor laminated bodies includes a first semiconductor layer, an active layer, and a second semiconductor layer laminated in this order, and includes a first electrode and a second electrode each having a slender shape and electrically connected to the first semiconductor layer and the second semiconductor layer, respectively, and
    the connector is electrically connected to the first electrode and the second electrode, respectively, on the first semiconductor layer and the second semiconductor layer, and the connector is wider than the first electrode and the second electrode.

13. The semiconductor light emitting element according to claim 1, wherein
each of the semiconductor laminated bodies includes a first semiconductor layer, an active layer, and a second semiconductor layer laminated in this order, and
the connector has a shape that is wider at a part straddling the groove than a width at a part disposed on the first semiconductor layer and the second semiconductor layer.

14. The semiconductor light emitting element according to claim 12, wherein
the connector is connected to a long side of the first electrode and the second electrode.

15. The semiconductor light emitting element according to claim 2, wherein
the first protrusion protrudes toward the second light emitting element component from a side of the first light emitting element component.

16. The semiconductor light emitting element according to claim 2, wherein
the first protrusion protrudes toward a side of the second light emitting element component from a side of the first light emitting element component.

17. The semiconductor light emitting element according to claim 2, wherein
the second light emitting element component has a second protrusion that protrudes toward the first protrusion from a side of the second light emitting element component.

18. A semiconductor light emitting element comprising:
an insulating substrate having a plurality of convex portions on a surface thereof;
a plurality of light emitting element components having semiconductor laminated bodies that are laminated on the insulating substrate and are separated from one another by a groove that exposes the convex portions on the surface of the insulating substrate, and the light emitting element components being disposed in a matrix in which sides of the light emitting element components in a column direction and a row direction in plan view face each other; and
a plurality of connectors connecting the light emitting element components,
the light emitting element components including a first light emitting element component and a second light emitting element component disposed obliquely in plan view,
the first light emitting element component having a first protrusion disposed at a corner of the first light emitting element and protruding toward a corner of the second light emitting element component, and
the connectors including a first connector having a shape that straddles the groove separating the first protrusion and the corner of the second light emitting element component and that follows the convex portions on the surface of the insulating substrate, the first connector having a straight section extending from the first protrusion toward the corner of the second light emitting element component.

19. The semiconductor light emitting element according to claim 18, wherein
the second light emitting element component has a second protrusion that is disposed at the corner of the second light emitting element component and protrudes toward the first protrusion.

20. The semiconductor light emitting element according to claim 18, wherein
each of the semiconductor laminated bodies includes a first semiconductor layer, an active layer, and a second semiconductor layer laminated in this order, and the first light emitting element component has an exposed portion including the first protrusion where the first semiconductor layer is exposed at the corner of the first light emitting element component, and
at least one of the connectors is electrically connected to the first semiconductor layer on the exposed portion.

21. The semiconductor light emitting element according to claim 18, wherein
a distance from the first protrusion to the corner of the second light emitting element component is the same as a maximum distance between two adjacent ones of the light emitting elements in the column direction or the row direction.

22. The semiconductor light emitting element according to claim 19, wherein
a distance between the first protrusion and the second protrusion is the same as a maximum distance between two adjacent ones of the light emitting element components in the column direction or the row direction.

23. The semiconductor light emitting element according to claim 18, wherein
the connectors include a second connector connecting two adjacent ones of the light emitting element components in the column direction or the row direction, and
a distance between the two adjacent ones of the light emitting element components connected by the second connector is greater than a distance between two adjacent ones of the light emitting element components in the column direction or the row direction but are not connected by the second connector.

24. The semiconductor light emitting element according to claim 18, wherein
the light emitting element components are arranged in a matrix of having an even number of columns and an even number of rows.

25. The semiconductor light emitting element according to claim 18, further comprising
an insulating film that covers the groove, side faces of the semiconductor laminated bodies adjacent to the groove, and the semiconductor laminated bodies directly under the connector.

26. The semiconductor light emitting element according to claim 18, wherein
each of the semiconductor laminated bodies includes a first semiconductor layer, an active layer, and a second semiconductor layer laminated in this order, and includes a first electrode and a second electrode each having a slender shape and electrically connected to the first semiconductor layer and the second semiconductor layer, respectively, and
the connectors are electrically connected to the first electrode and the second electrode, respectively, on the first semiconductor layer and the second semiconductor layer, and the connectors are wider than the first electrode and the second electrode.

27. The semiconductor light emitting element according to claim 18, wherein each of the semiconductor laminated bodies includes a first semiconductor layer, an active layer, and a second semiconductor layer laminated in this order, and each of the connectors has a shape that is wider at a part straddling the groove than a width at a part disposed on the first semiconductor layer and the second semiconductor layer.

28. The semiconductor light emitting element according to claim 26, wherein the connectors are connected to a long side of the first electrode and the second electrode.

\* \* \* \* \*